(12) United States Patent
Berman et al.

(10) Patent No.: US 8,995,206 B2
(45) Date of Patent: Mar. 31, 2015

(54) DEVICE, METHOD AND COMPUTER READABLE PROGRAM FOR ACCESSING MEMORY CELLS USING SHORTENED READ ATTEMPTS

(75) Inventors: Amit Berman, Nesher (IL); Yitzhak Birk, Hod Hasharon (IL)

(73) Assignee: Technion Research and Development Foundation Ltd., Haifa (IL)

( * ) Notice: Subject to any disclaimer, the term of this patent is extended or adjusted under 35 U.S.C. 154(b) by 299 days.

(21) Appl. No.: 13/547,091

(22) Filed: Jul. 12, 2012

(65) Prior Publication Data

US 2013/0044547 A1 Feb. 21, 2013

Related U.S. Application Data

(60) Provisional application No. 61/507,616, filed on Jul. 14, 2011.

(51) Int. Cl.
*G11C 16/06* (2006.01)
*G11C 16/26* (2006.01)
*G11C 16/34* (2006.01)

(52) U.S. Cl.
CPC ............... *G11C 16/06* (2013.01); *G11C 16/26* (2013.01); *G11C 16/34* (2013.01)
USPC ................................ 365/189.07; 365/185.18

(58) Field of Classification Search
CPC ....... G06F 13/14; G06F 13/16; G06F 13/161; G06F 2213/0064; G06G 2212/1024; G11C 2207/2272; G11C 16/3459; G11C 16/26; G11C 16/34; G11C 16/32; G11C 7/22; G11C 7/222; G11C 7/225; G11C 7/227

USPC ................. 714/715, 718, 719, 720, 763, 773; 365/185.18, 185.24, 189.07, 190, 191, 365/204

See application file for complete search history.

(56) References Cited

U.S. PATENT DOCUMENTS

| | | | |
|---|---|---|---|
| 7,826,269 B2 * | 11/2010 | Kang ........................ | 365/185.18 |
| 8,335,977 B2 * | 12/2012 | Weingarten et al. .......... | 714/794 |
| 2005/0018481 A1 * | 1/2005 | Guterman et al. ........ | 365/185.03 |
| 2005/0157555 A1 * | 7/2005 | Ono et al. ................ | 365/185.18 |
| 2007/0236990 A1 * | 10/2007 | Aritome .................... | 365/185.01 |
| 2008/0253217 A1 * | 10/2008 | Taeuber et al. .......... | 365/230.06 |
| 2009/0240872 A1 * | 9/2009 | Perlmutter et al. ........... | 711/103 |
| 2012/0063227 A1 * | 3/2012 | Weingarten et al. ..... | 365/185.09 |

* cited by examiner

*Primary Examiner* — Albert Decady
*Assistant Examiner* — Christian Dorman
(74) *Attorney, Agent, or Firm* — Oren Reches

(57) ABSTRACT

A device, a computer readable medium and a method that may include performing a shortened read attempt of multiple data memory cells that store data to provide an estimate of the data; wherein the shortened read attempt has a duration that is shorter than a duration of a full read attempt; performing a shortened read attempt of redundant memory cells that store redundant information to provide an estimate of the redundant information; wherein the estimate of the redundant information is indicative of an expected number of data memory cells that store a certain logic value; determining, based on the estimate of the data, an estimated number of data memory cells that store the certain logic value; comparing the expected number to the estimated number; and providing the estimate of the data as a read result if the expected number and the estimated number equal each other.

42 Claims, 15 Drawing Sheets

DEVICE, METHOD AND COMPUTER READABLE PROGRAM FOR ACCESSING MEMORY CELLS USING SHORTENED READ ATTEMPTS

RELATED APPLICATIONS

This application claims the benefit of U.S. provisional patent Ser. No. 61/507,616, filing date Jul. 14, 2011, which is incorporated herein by reference.

BACKGROUND

Flash memory is a non-volatile memory component, widely used in modern electronic systems. The growing demand for high performance computing along with high capacity data storage stimulates flash technology development. Flash enhancement includes aggressive scaling, which positions NAND flash as currently the most dense semiconductor circuit (as low as 20 nm for half pitch in 2011), and drives innovations for faster read and program (write) operations. New product markets, such as e-books, tablets, smartphones, and portable media players have no practical alternative to flash due to their thin structure, and require fast memory response.

Fast access time is a fundamental requirement while employing flash for system usage. As flash storage capacity doubles every two years, improvements in read speed are required to cope with the growing desired data transfer rates. However, as technology shrinks, and multi-level cell (MLC) techniques are implemented, achieving low read latency becomes harder. Technology scaling forces accurate read voltages, which has direct effects on timing. Multi-level cell (MLC) architectures, aimed to reduce cost, allow the storage of multiple bits per memory cell, but so doing prolongs the read and write operations because of accurate, tightly spaced sensing voltages and a need for multiple comparisons in order to determine the cell's content.

The requirement for high read speed is addressed in several ways. NOR array architecture enables random access read but reduces the memory density nearly twofold relative to NAND array, due to additional contacts between memory cells. It also entails a more complex manufacturing process. Circuit optimizations include cache read and charge pump optimization. Architecture directions include multi-page programming, multiple plains on chip, as well as multi-channel and multi-chip architectures for parallel read (RAID-like structures).

Flash memory cell physical structure is a MOSFET transistor with a floating gate layer, surrounded by a dielectric stack. The information is expressed as the amount of electrical charge stored in the floating gate layer. As a result, an erased cell (no electrons in the floating gate) will have a lower threshold voltage than a programmed cell. The information is read by checking the conductivity of the memory cell with one or more gate voltages. An erased flash cell has a threshold voltage below 0V. If written, cell threshold voltage is positive but smaller than 4V. (The actual numbers vary with technology.) Biasing the gate of the selected cell with 0 v, the cell will conduct current if it is erased, and will not conduct current if it has been written to. For gate voltages higher than 4V, the cell will always conduct current. This characteristic is exploited during read when a set of cells are connected in series and all those cells, except the one being addressed, must operate as pass transistors, i.e., conduct.

A Flash memory cell array can be organized in several architectures. The two common architectures are NOR and NAND. In the NOR architecture, cells are arranged in parallel, in a similar form to NMOS transistors in a NOR logic gate; in the NAND architecture, they are arranged in series. Read is performed faster (order of nanoseconds vs. microseconds) in the NOR architecture, whereas program and erase are performed faster in the NAND architecture.

NAND Flash cells are connected in series (resembling NMOS transistors in CMOS logic) and are organized in strings, each representing a bitline. (This is a drain-to-source connection.) Each bitline is connected to the drain or source of a first NMOS transistor of a string. The gates of all NMOS transistors that have the same position in their respective strings, referred to herein as residing in the same row, have their gates connected to the same wordline.

FIG. 1A shows a prior art NAND Flash memory cell array 100 with multiple CMOS transistors 102 that are arranged in an array. The memory array matrix consists of N wordlines (WL) 120(1)-120(N), connected in separate strings, each string holds typically up to 64 cells, and M bitlines (BL) 110(1)-110(M), typically up to 64 thousands.

Each NAND string is accessed through drain-select line (DSL) such as DSL 134. All strings are connected to source line through source-select line (SSL) 132. When we read a cell, its wordline is fixed at 0 v, while other cells in its string (bitline) are biased (through their wordlines) with high voltages (usually 4-5V), so that they operate as pass transistors regardless of their Vt value.

The amount of charge stored in the floating gate can be quantized into multiple, non-overlapping, contiguous ranges of charge level, each of which is conveniently referred to herein as a level. A single level cell (SLC) stores one program level and the erase level, hence one bit per cell. Multi-level cells (MLC) have more than one program level and can store multiple bits per cell. Switching to MLC architectures will result in additional read latency, e.g. additional 50 µs for the time that memory cells are transferred to temporary internal memory buffer during read (usually SRAM). NAND read performance is determined by two components: NAND array access time, and data transfer rate across the bus.

As NAND page size increases, latency becomes large, especially for small reads. NAND array read transfer time SLC tR time is 20-25 µs MAX, MLC is 50 µs MAX (typically). The push for density results in slower NAND array access.

FIG. 1B illustrates a prior art NOR flash memory array and FIG. 1C illustrates a prior art NOR flash read circuit. The NOR Flash memory array 101 consists of N wordlines (WL) and M bitlines (BL). Each memory cell is connected both to bitline and source.

The Read operation in NOR flash is commonly achieved by either of two methods: current sensing, and voltage sensing. With current sensing, the drain current is kept fixed, while with voltage sensing the gate voltage remains fixed. FIG. 1C describes current sensing. A flash memory cell 141 placed on a specific bitline (BL). The bitline parasitic capacitance Cbl 151. The bitline is connected via a column decoder 143 and an additional transistor 145 to a node that is connected to a load resistor 147 and to a positive input of comparator 149. A reference flash memory cell 142 having capacitance Cbl 152 is connected via a column decoder 144 and an additional transistor 146 to a node that is connected to a load resistor 148 and to a negative input of comparator 149. During a precharge phase, $C_{BL}$ is being charged. In evaluation phase, $C_{BL}$ is discharged if $V_{WL}$ is above the voltage threshold of the flash memory cell, and retains the charge otherwise. If $C_{BL}$ was discharged than $T_{BIAS}$ is open and the current through $R_1$ is high. Otherwise, the current is low. Determining the logic level is done by comparing the currents on the memory and reference sides. If the cell is programmed (for multi-level cell: has a higher threshold voltage than $V_{WL}$) the sensed information does not depend on the evaluation time (since $C_{BL}$ is not discharged). The errors resulted from shorten evaluation time share uni-directional also in the case of NOR flash and speculative early sensing concept can be applied.

Dynamic-random-access memory (DRAM) is a volatile memory component. Due to its performance, it is the technology-of-choice for computer memory today. DRAM cell is a capacitor which states of charged or discharged represent the state of the stored binary digit. DRAM memory array is organized in a matrix form, consists of rows (wordlines) and columns (bitlines). FIG. 12 illustrates a DRAM cell 1200 that is represented by a capacitor 1201, DRAM transistor 1202, bit line 1204, word line 1203 and a sense terminal 1205. FIG. 13 illustrates an array 1300 that includes twelve DRAM cells that are arranged in three rows (coupled to word lines WL1-WL3) and in four columns (coupled to bit lines BL1-BL4). In a single row, each DRAM cell is connected to unique column through access device (typically MOSFET transistor). Access devices can be switch on or off. If access device is on, and all other access devices on the same column are off, the DRAM cell content would be read, else it would be ignored. All access devices on the same row are controlled by a row (wordline) signal.

DRAM read process is as follows: access device is turned on (while and all other access devices on the same column are off), and the capacitor charge (if any) is discharged through the access device to the column associated with the DRAM cell. Each column is connected to sense amplifier that translates the charge or current on the bitline to a logic signal of '0' or '1'. The output signal is latched in a temporary buffer and may be transferred out of the memory chip according to chip's control signals.

Prior to read, the capacitor state can be either charged or discharged. If discharged, the read time (consists of discharging the capacitor and translating the charge or current to logic signal by the sense amplifier) can be shorten to zero. Else, the read time depends on the capacitor electrical parameters (area, capacitance, resistance, etc.) and on the bitline and sense amplifier electrical parameters.

In manufacturing process, the electrical parameters may vary from one cell to another, and from one bitline to another, making the required read time to vary from cell to cell. Typically, the manufacturer provides the "worst-case" read time in order to get valid data in any case.

If the time from turning on the access device to latching the output logical signal of the sense amplifier is shorten, the latched data might have errors (depends on the electrical parameters of the cells).

The data errors resulting from shorten sensing (as described above) would always be uni-directional. Only cells that store enough charge that represent logic '1' would be error-prone (since they might not be fully discharged during the shorten sensing).

Using error detection code (Berger code) any amount of errors that resulting from shorten sensing can be detected. If other error detection code is used, the errors can be detected under some probability.

Since the process of error detection is short with respect to DRAM data read, it can be used beneficially to increase read speed, namely, output the data in shorten read attempts in case it is valid.

If data is not valid, consecutive bitline sensing would be performed at a later time to increase the probability of valid data sensing.

In the process of performing shorten read attempts, statistical information about row or cell sensing time can be gathered and used in future read attempts.

It is therefore the purpose of the current invention to expedite the access to memory, thereby increasing overall performance, and to do so without compromising the correctness of the written or read data.

SUMMARY

According to an embodiment of the invention a method is provided. The method may include: Performing a shortened read attempt of data and redundant information to provide an estimate of the data and an estimate of the redundant information. The shortened read attempt has a duration that is shorter than a duration of a full read attempt; processing the estimate of the data to provide a first signature. Processing the estimation of the redundant information to provide a second signature. Errors induced by the shortened read attempt may affect the first signature and the second signature in different manners. Comparing the first signature to the second signature; and providing the estimate of the data as a read result if the first and second signatures equal each other. The redundant information can be the second signature and in this case the processing of the second signature can include merely retrieving the second signature.

The method may include repeating the performing, processing, processing and comparing until the first signature of a certain iteration of these repetitions equals the second signature of that certain iteration.

The method may include attempting to correct at least one of the estimation of the data and the estimation of the redundant information.

The method may include performing the short read attempt by: performing a shortened read attempt of multiple data memory cells that store data to provide an estimate of the data; and performing a shortened read attempt of redundant memory cells that store redundant information to provide an estimate of the redundant information; wherein the second signature is indicative of an expected number of data memory cells that store a certain logic value; wherein the first signature is indicative of an estimated number of data memory cells that store the certain logic value.

The comparing of the first signature to the second signature may include comparing the expected number to the estimated number; and wherein the method comprises providing the estimate of the data as a read result if the expected number and the estimated number equal each other; wherein errors induced by any shortened read attempt affect the expected number and the estimated number in different manners.

The data memory cells may differ from redundant memory cells.

At least one data memory cell may be also a redundant memory cell.

The shortened read attempt may be expected to introduce at least zero errors to the estimate of data along a first direction; wherein the shortened read attempt is expected to introduce at least zero errors to the estimate of the redundant information along a second direction, the second direction differs from the first direction; wherein the first and second directions are selected from a group consisting of a direction of increase and a direction of decrease.

The estimate of the data may represent an estimated amount of charge being stored at the multiple data memory cells. The data may represent an actual amount of charge being stored at the multiple data memory cells. The actual amount of charge may not exceed the estimated amount of charge. Thus—an estimate can result in estimating a higher charge level than the actual charge level but not vice versa.

The method may include declaring a shortened read attempt error if the expected number differs from the estimated number.

The method may include performing a read attempt of a duration that exceeds the duration of the shortened read attempt if the expected number differs from the estimated number.

The method may include correcting the estimation of the data, by applying an error correction decoding process, if the expected number differs from the estimated number.

The method may include correcting the estimation of the redundant information, by applying an error correction decoding process, if the expected number differs from the estimated number.

The method may include performing a full duration read attempt if the expected number differs from the estimated number.

The memory cells may be single level cells (SLC); wherein the certain logic value is an erase logic value; wherein the first direction is the direction of increase and the second direction is the direction of decrease.

The memory cells may be single level cells (SLC); wherein the certain logic value is an erase logic value; and the estimate of the redundant information is indicative of an expected number of data memory cells that are programmed.

The memory cells may be multiple level cells (MLC) to be read by a set of reference voltages, the set of reference voltages comprises multiple reference voltages that differ from one another; wherein the method may include repeating, for at least one reference voltage of the multiple reference voltages, the stages of: performing, using the reference voltage, a shortened read attempt of multiple data memory cells that store data to provide an estimate of the data; performing, using the reference voltage, a shortened read attempt of redundant memory cells that store redundant information that is associated with the reference voltage to provide an estimate of the redundant information; wherein the redundant information is indicative of a reference-voltage-associated expected number of data memory cells that store a logic value that is determined by supplying the reference voltage to the data memory cells; determining, based on the estimate of the data, a reference-voltage-associated estimated number of data memory cells that store the logic value; wherein the method further comprises processing multiple reference-voltage-associated expected numbers and multiple reference-voltage-associated estimated numbers to determine whether at least one shortened read attempt introduced errors.

The method may include comparing, for each reference voltage of that at least one reference voltages, a reference-voltage-associated expected number and a reference-voltage-associated estimated number that are associated with the reference voltage; and declaring a shortened read attempt error if at least one of the comparisons is indicative of a mismatch between a reference-voltage-associated expected number and a reference-voltage-associated estimated number that are associated with a same reference voltage.

The method may include adding all the reference-voltage-associated expected numbers to provide an aggregate expected number; adding all the reference-voltage-associated estimated numbers to provide an aggregate estimated number; comparing the aggregate expected number to the aggregate estimated number; and declaring a shortened read attempt error if the aggregate expected number to the aggregate estimated number.

The method may include error-correcting the estimate of the redundant information to provide the expected number.

According to an embodiment of the invention, a method for writing a logic value data to a memory cell may be provided and may include: repetitively performing (a) a write attempt to the memory cell and (b) a shortened read attempt of the memory cells to provide an estimate of the value that is stored at the memory cell, until the estimated value equals the logic value; performing, if the estimated value equals the logic value, a full read attempt of the memory cell to provide a full read value; and determining that the writing of the logic value is completed if the full read value equals the logic value. A writing process of a logic value can include one or more write attempts—the write attempts can also be referred to as programming steps.

The estimated value may represent an estimated amount of charge being stored in the memory cell; wherein the logic value represents an actual amount of charge being stored in the data memory cell; and wherein the actual amount of charge does not exceed the estimated amount of charge.

The method may include performing at least one additional write attempt if the full read value differs from the logic value.

The repetitive performance of the write attempt that is followed by a read attempt may be preceded by at least one initial write attempt that is not followed by a read attempt.

The logic value may differ from an erase value; wherein the method further comprises repetitively performing, until the full read value equals the erase value, (a) a write attempt to the memory cell and (b) a full read attempt of the memory cell to provide the full read value.

According to an embodiment a device may be provided and may be able to include any of the mentioned above methods. The device may include a shortened read circuit arranged to: perform a shortened read attempt of data and redundant information to provide an estimate of the data and an estimate the redundant information; wherein the shortened read attempt has a duration that is shorter than a duration of a full read attempt; and a controlling circuit arranged to: process the estimation of the data to provide a first signature; process the estimation of the redundant information to provide a second signature; wherein errors induced by the shortened read attempt affect the first signature and the second signature in different manners; compare the first signature to the second signature; and provide the estimate of the data as a read result if the first and second signatures equal each other.

The controller circuit may be further arranged to attempt to correct at least one of the estimation of the data and the estimation of the redundant information.

The second signature may be indicative of an expected number of data memory cells that store a certain logic value; and the first signature may be indicative of an estimated number of data memory cells that store the certain logic value.

According to an embodiment of the invention a device may be provided and may include (a) a shortened read circuit that is arranged to: perform a shortened read attempt of multiple data memory cells that store data to provide an estimate of the data; wherein the shortened read attempt has a duration that is shorter than a duration of a full read attempt; and perform a shortened read attempt of redundant memory cells that store redundant information to provide an estimate of the redundant information; wherein the estimate of the redundant information is indicative of an expected number of data memory cells that store a certain logic value; and (b) a controlling circuit arranged to: determine, based on the estimate of the data, an estimated number of data memory cells that store the certain logic value; compare the expected number to the estimated number; and provide the estimate of the data as a read result if the expected number and the estimated number equal each other; wherein errors induced by any shortened read attempt affect the expected number and the estimated number in different manners.

According to an embodiment of the invention a device may be provided and may include: a write circuit arranged to repetitively perform (a) a write attempt to the memory cell and (b) a shortened read attempt of the memory cells to provide an estimated value that is stored at the memory cell, until the estimated value equals the logic value; a read circuit arranged to perform a full read attempt of the memory cell, if the estimated value equals the logic value, to provide a full read value; and wherein the write circuit is arranged to determine that the writing of the logic value is completed if the full read value equals the logic value.

According to an embodiment of the invention a non-transitory computer readable medium may be provided that may store instructions for: performing a shortened read attempt of multiple data memory cells that store data to provide an estimate of the data; wherein the shortened read attempt has a duration that is shorter than a duration of a full read attempt; performing a shortened read attempt of redundant memory cells that store redundant information to provide an estimate of the redundant information; wherein the estimate of the redundant information is indicative of an expected number of data memory cells that store a certain logic value; determining, based on the estimate of the data, an estimated number of data memory cells that store the certain logic value; comparing the expected number to the estimated number; and providing the estimate of the data as a read result if the expected number and the estimated number equal each other; wherein errors induced by any shortened read attempt may affect the expected number and the estimated number at different manners.

According to an embodiment of the invention a non-transitory computer readable medium may be provided and may store instructions for: repetitively performing (a) a write attempt to the memory cell and (b) a shortened read attempt of the memory cells to provide an estimated value that is stored at the memory cell, until the estimated value equals the logic value; performing a full read attempt of the memory cell, if the estimated value equals the logic value, to provide a full read value; and determining that the writing of the logic value is completed if the full read value equals the logic value.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE DRAWINGS

Figure 1A:
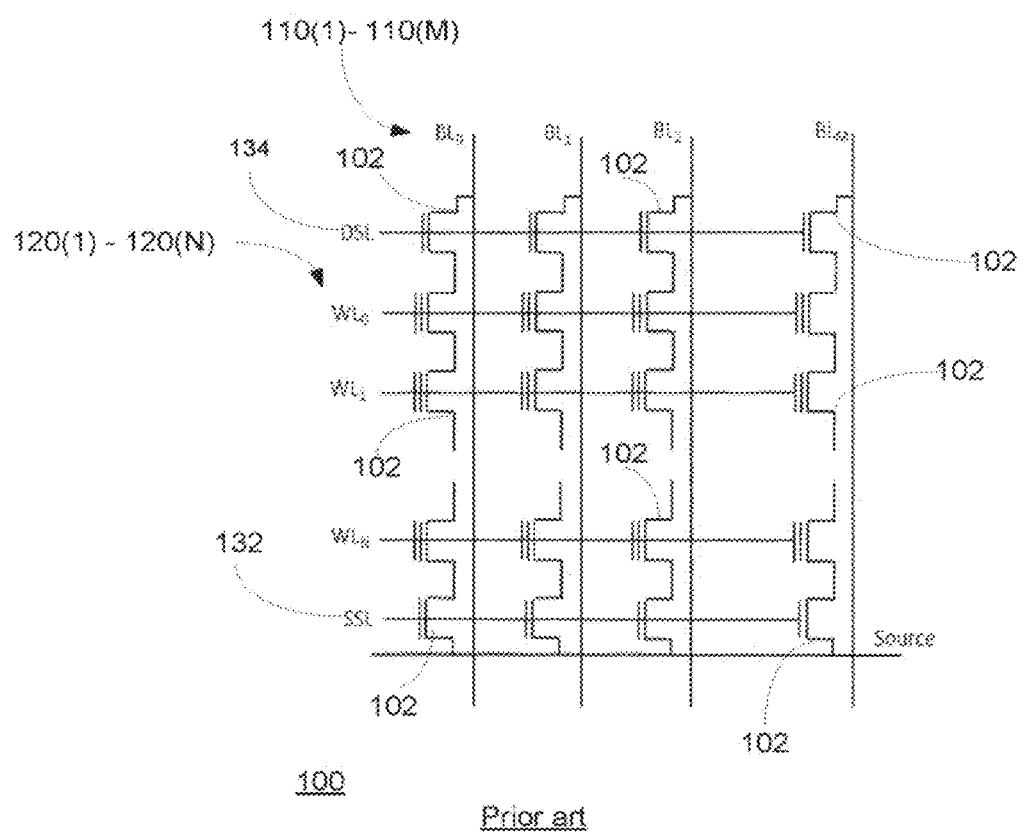
FIG. 1A illustrates a prior art NAND flash memory cell array.
Figure 1B:
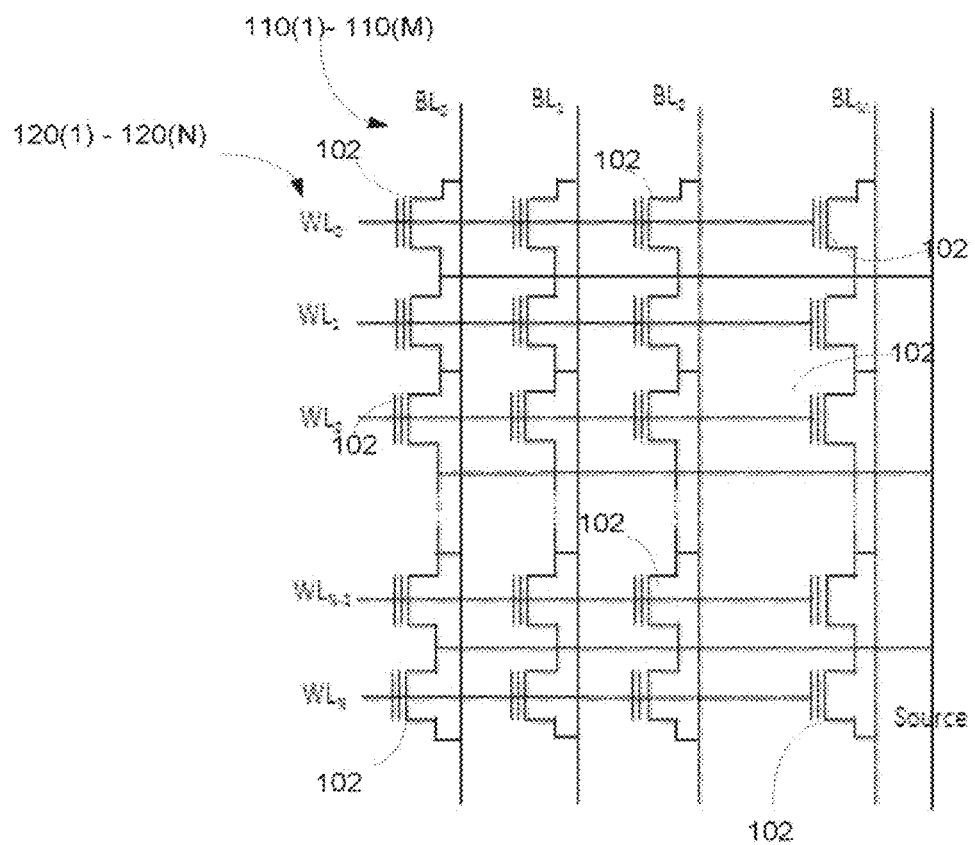
FIG. 1B illustrates a prior art NOR flash memory array.
Figure 1C:
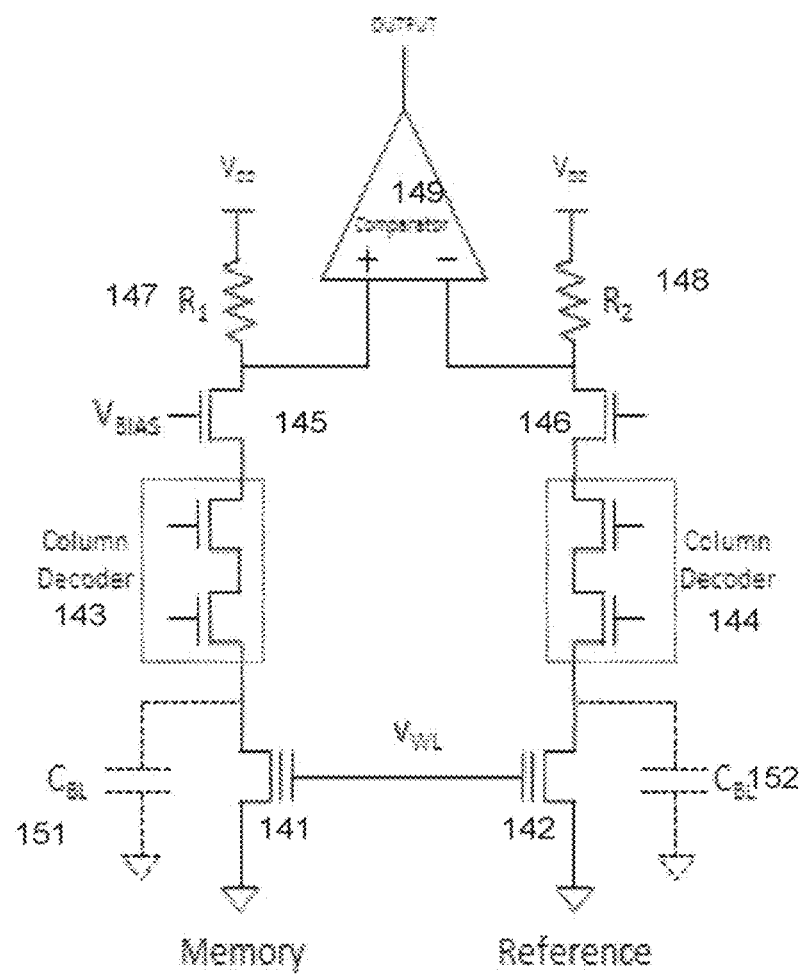
FIG. 1C illustrates a prior art NOR flash read circuit.

The foregoing and other objects, features, and advantages of the present invention will become more apparent from the following detailed description when taken in conjunction with the accompanying drawings. In the drawings, similar reference characters denote similar elements throughout the different views.

Because the illustrated embodiments of the present invention may, for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

The terms "amount of charge" and "threshold voltage" are used synonymously, both for facility of exposition and because the values of both correspond to the information content of a memory cell.

A data memory cell stores data, and redundant memory cell stores redundant information. These cells (data and redundant cells) can differ from each other. It is noted that in various embodiments of the invention a memory cell can store data and redundant information and thus can be regarded as a data memory cell and as a redundant memory cell. Thus a single read attempt of such memory cell provides both data and redundant information.

It is noted that the type of memory cells (parameter values, construction, etc.) used to store data and redundant information can be the same or different. Any given memory cell can be used to store either user information (data) or redundant information. The content stored in a particular memory cell at a particular time may be a combination of data and redundant information. For example, when non-systematic codes are used, whereby given k bits of data, one computes k+r bits that uniquely correspond to the original k bits. (In a systematic code, one computes r bits from the k original bits and stores those alongside the k. In a non-systematic code, the original bits are not separable.)

The following description refers to a NAND flash memory cell array although the methods and systems can be applied mutatis mutandis to other memory cell arrays such as but not limited to NOR flash memory cell arrays or memory cell arrays that are not flash memory cell arrays but may exhibit uni-directional errors as a result of the shortened read attempt. In the case of the NOR flash memory cell array, the sense time can be shortened (during a shortened read attempt) or full (during a full read attempt). Non-limiting examples of such memory arrays may include non-volatile memory arrays that differ from flash memory arrays.

Furthermore, the methods and systems can be applied mutatis mutandis to volatile as well as non-volatile memory cells arrays. For example, the methods and systems can be applicable to dynamic random access memory (DRAM). In DRAM, data is store as a capacitor's voltage. During cell sensing, the capacitor is discharged and thus early sensing errors are uni-directional.

According to various embodiments of the invention the methods and systems may be arranged to cope with errors that are not uni-directional or otherwise do not result from the shortened duration of the shortened read attempt. Such errors can be managed by applying error correction codes that can cope with multiple errors, including dual directional errors. For example, instead of using a Berger code a CRC code can be applied.

According to an embodiment of the invention, a shortened read attempt is provided. The duration of the shortened read attempt is shorter than the duration of a full read attempt. It can be shorter by few percents, few ten percents and the like. For example—it can be shorter by 1-80% of the duration of the full read attempt. The full read attempt is a read attempt as done without the teachings of the current invention, having a duration that guarantees that the duration of the read attempt does not introduce by itself errors. The full read attempt can also be regarded as a nominal read attempt.

The duration of the full read attempt can be provided by the manufacturer of the flash memory cell array, determined by testing, and the like.

The shortened read attempt can include a pre-charge phase or may be preceded by a pre-charge phase. The shortened read attempt may include a shortened charge evaluation phase during which data (or redundant information) is sampled at some time prior to the nominal time (of a full read attempt).

The shortened read attempt (and especially the shortened duration of the shortened read attempt) can introduce errors. These errors can be detected by implementing an error correction code that uses redundant information that is stored along with the data. (The redundant information can be stored in the same chip or even page as the data or elsewhere.) If an error is found the data can be re-read—either by performing a full read attempt or by performing another shortened read attempt—preferably of a longer duration than the failed shortened read attempt.

The saving gain in evaluation time acquired by the shortened read attempt may offset the additional latency of correctness verification (or, occasionally, error detection) and of a re-read attempt that is applied seldom, upon detection of an error, thus resulting in a reduced average read time. This concept can be extended by employing an error correction module, and reducing the pre-charge time in the first read phase.

It is noted that all of the mentioned below methods can include error correction. Thus, an estimate of a data can be error-corrected, an estimate of redundant information can be error-corrected or both.

Figure 2:
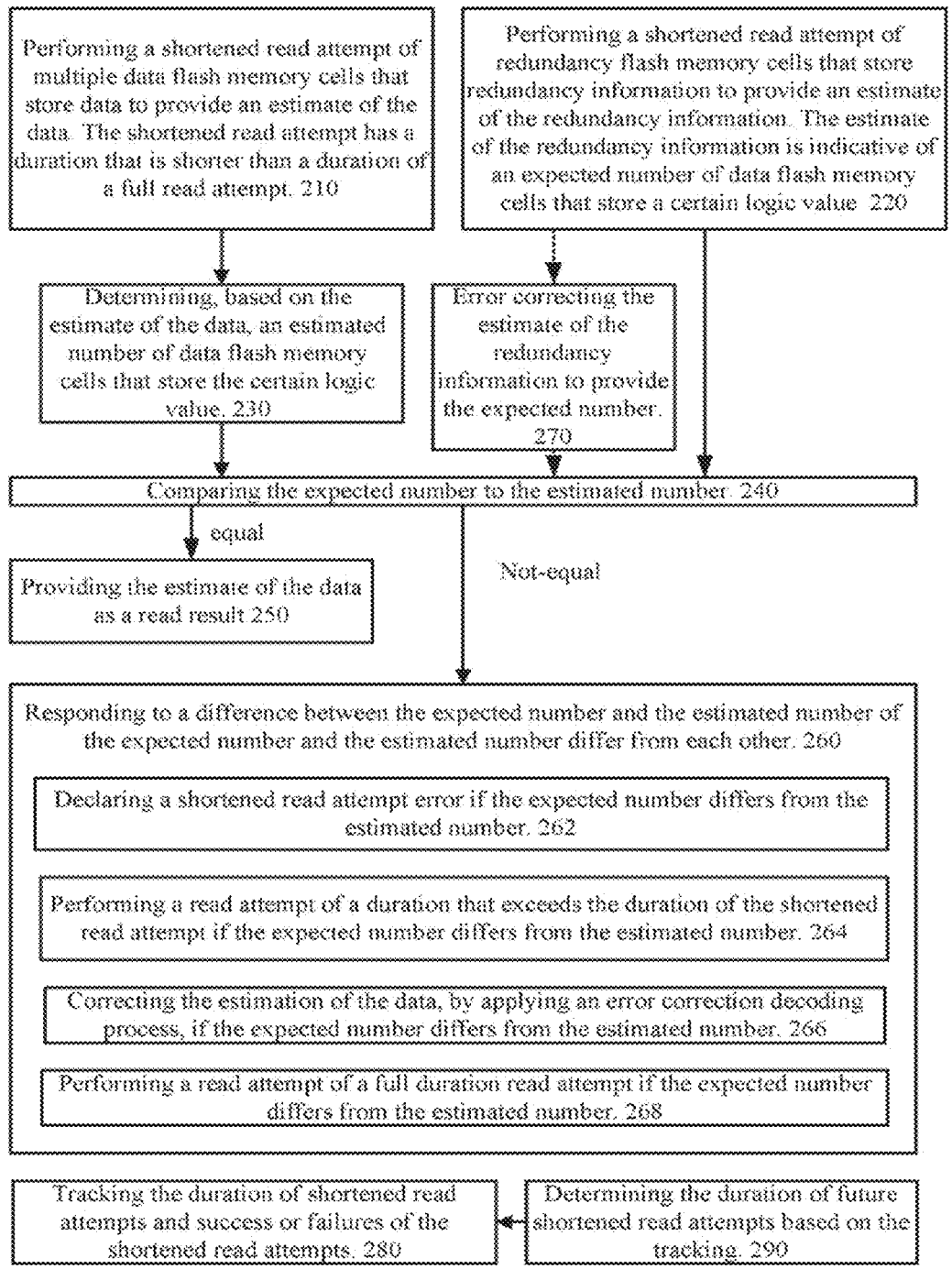
FIG. 2 illustrates a method according to an embodiment of the invention.

FIG. 2 illustrates method 200 for reading a flash memory cell array, according to an embodiment of the invention.

Method 200 starts by stages 210 and 220.

Stage 210 includes performing a shortened read attempt of multiple data flash memory cells that store data to provide an estimate of the data. The shortened read attempt has a duration that is shorter than the duration of a full read attempt.

Stage 220, that may be performed concurrently with stage 210, includes performing a shortened read attempt of redundant flash memory cells that store redundant information (a "signature" derived from the data and stored) to provide an estimate of the redundant information. The estimate of the redundant information is indicative of an expected number of data flash memory cells that store a certain logic value. The redundant information is required for the shortened read process. Other redundant information can be used for performing error detection and error correction of data for errors not attributed to the shortened read process. The other redundant information can be regarded as a part of the data.

The determination of which flash memory cells are data flash memory cells and which are redundant flash memory cells is done before programming the flash memory cells. The determination can change over time.

The shortened read attempt may be expected to introduce at least zero errors to the estimate of data only along a first direction and to introduce at least zero errors to the estimate of the redundant information only along a second direction. The second direction differs from the first direction. The first and second directions can be either a direction of increase or a direction of decrease.

The estimate of the data may represent an estimated amount of charge being stored at the multiple data flash memory cells. The data may represent an actual amount of charge being stored at the multiple data flash memory cells. In a flash memory cell array the actual amount of charge does not exceed the estimated amount of charge.

Stage 210 is followed by stage 230 of determining, based on the estimate of the data, an estimated number of data flash memory cells that store the certain logic value.

The shortened read attempt can affect the expected number and the estimated number in different manners. It can, for example, introduce uni-directional errors such as errors that indicate that more charge is stored at the data flash memory cells than the actual amount of charge. Thus, the value of the estimate of data will reflect more charge than the charge actually stored in the data flash memory cells. On the other hand, the estimate of the redundant information can be indicative of less charge in the data flash memory cell—when the certain logic value is selected to represent a logic value that reflects less charge.

Referring to a single level cell (SLC)—the shortened read attempt can cause an erase value to appear as a programmed value but not vice verse. The redundant information may reflect the number of flash memory cells that store the erase value.

Thus, the shortened read attempt of data can result in an estimate of data that will indicate that more data flash memory cells are programmed than the actual number of such flash memory cells. On the other hand, the estimate of the redundant information (for example when said information is the number of the erase value data flash memory cells) can indicate that fewer flash memory cells are programmed than the actual number of such flash memory cells—as it counts the number of flash memory cells that store the erase value. Thus, one or more errors introduced by the shortened read attempt will definitely result in differences between the estimated number of flash memory cells that store the logic value as represented by the redundant information and said estimate as computed from the estimate of the stored data.

Stages 220 and 230 are followed by stage 240 of comparing the expected number to the estimated number.

Stage 240 is followed by stage 250 of providing the estimate of the data as a read result if (a result of the comparing of stage 240) the expected number and the estimated number equal each other.

Stage 240 is followed by stage 260 of responding to a difference between the expected number and the estimated number.

Stage 260 may include at least one of the following:

a. Stage 262 of declaring a shortened read attempt error if the expected number differs from the estimated number.

b. Stage 264 of performing a read attempt of a duration that exceeds the duration of the shortened read attempt if the expected number differs from the estimated number.

c. Stage 266 of correcting the estimation of the data, by applying an error correction decoding process, if the expected number differs from the estimated number. Stage 266 may include applying an error correction code capable of managing uni-directional error or applying a error correction ode that can manage bi-directional errors.

d. Stage 268 of performing a full duration read attempt if the expected number differs from the estimated number.

If, for example, the method 200 is applied on single level cells (SLC) flash memory cells then the certain logic value is an erase logic value, the first direction is the direction of increase and the second direction is the direction of decrease.

If, for example, the flash memory cells are multiple level cells (MLC) that are to be read by a set of reference voltages, then the stages of method 200 can be repeated for each reference voltage, i.e., referring separately to the number of cells in each level, and requiring that all signatures match as an indication of correctness.

According to an embodiment of the invention stage 260 can include performing a sensing retry. The sensing retry can be performed in various manners.

If, for example, the very latching (sensing) of the data does not impact the bitline discharge, data latch can be performed again at a later time without another precharge. If the memory device is a pipelined memory device then the method 200 can wait until confirmation of correct reading (essentially sense continuously or at certain intervals) or release the access mechanism for use by the next access request, and retry upon failure. Accordingly, stages 210 and 220 can be followed by immediately releasing the access mechanism and not waiting to the outcome of other stages of the method (such as stage 240). Alternatively, the access mechanism can be reserved until receiving a positing outcome from stage 240.

Else, bitline precharge has to be re-applied, and read process has to be fully performed.

According to an embodiment of the invention method 200 can include a stage 270 of error correcting the estimate of the redundant information to provide the expected number. Stage 270 follows stage 220 and precedes stage 240.

According to an embodiment of the invention, method 200 can include stage 280 of tracking the duration of shortened read attempts and success or failures of the shortened read attempts. The tracking can be done per flash memory page, block or any other portion or for the entire flash memory cell array, and can be done singly for all levels or separately for subsets of levels. The results of the tracking can be used for determining (stage 290) the duration of future shortened read attempts (per flash memory page, block, and any portion of the flash memory cell array or per the entire flash memory cell array).

The tracking can take into account the state of the flash memory cell array or a portion thereof including read erase cycle count, life period and the like, when determining the duration of the next shortened read attempt.

Metadata that reflects the tracking results can be spatial speculative success of any page/block, success or over time (e.g., as the memory ages), It is expected that the duration of the shortened read attempt will increase as the read erase cycle count rises, as more errors are expected to be introduced during the shortened read attempt.

According to an embodiment of the invention metadata about suggested durations of shortened read attempts can be stored and used for future readings. The metadata can refer to a portion of a flash memory device (such as a page, a group of pages, a block, a group of blocks) or can refer to an entire memory die or memory device. If metadata relates to a certain portion of the memory device then the metadata can be stored within in that certain portion or elsewhere. The metadata can be stored in predetermined locations can be retrieved before reading other information store in that certain portion. Alternatively, the metadata can be read at the beginning of the reading of that information.

According to an embodiment of the invention this metadata can be kept separately (very few bits per page) and will be loaded into a fast memory so it can be accessed quickly as an aid to the main access (reading of the information). When the technique is used with relatively slow memory like Flash, the metadata can be loaded to a DRAM module. When the applied to DRAM (when the memory cells that stores the information are DRAM cells), the metadata can be loaded into a cache (SRAM), which is faster that the DRAM. Alternatively, the metadata can be stored in a translation buffer (aka TLB), which is a cache of virtual-to-physical address mappings and is very fast. A backup copy of the metadata and even of the information itself may be kept in non volatile memory cells so it is not lost when power is shut down.

Figure 9:
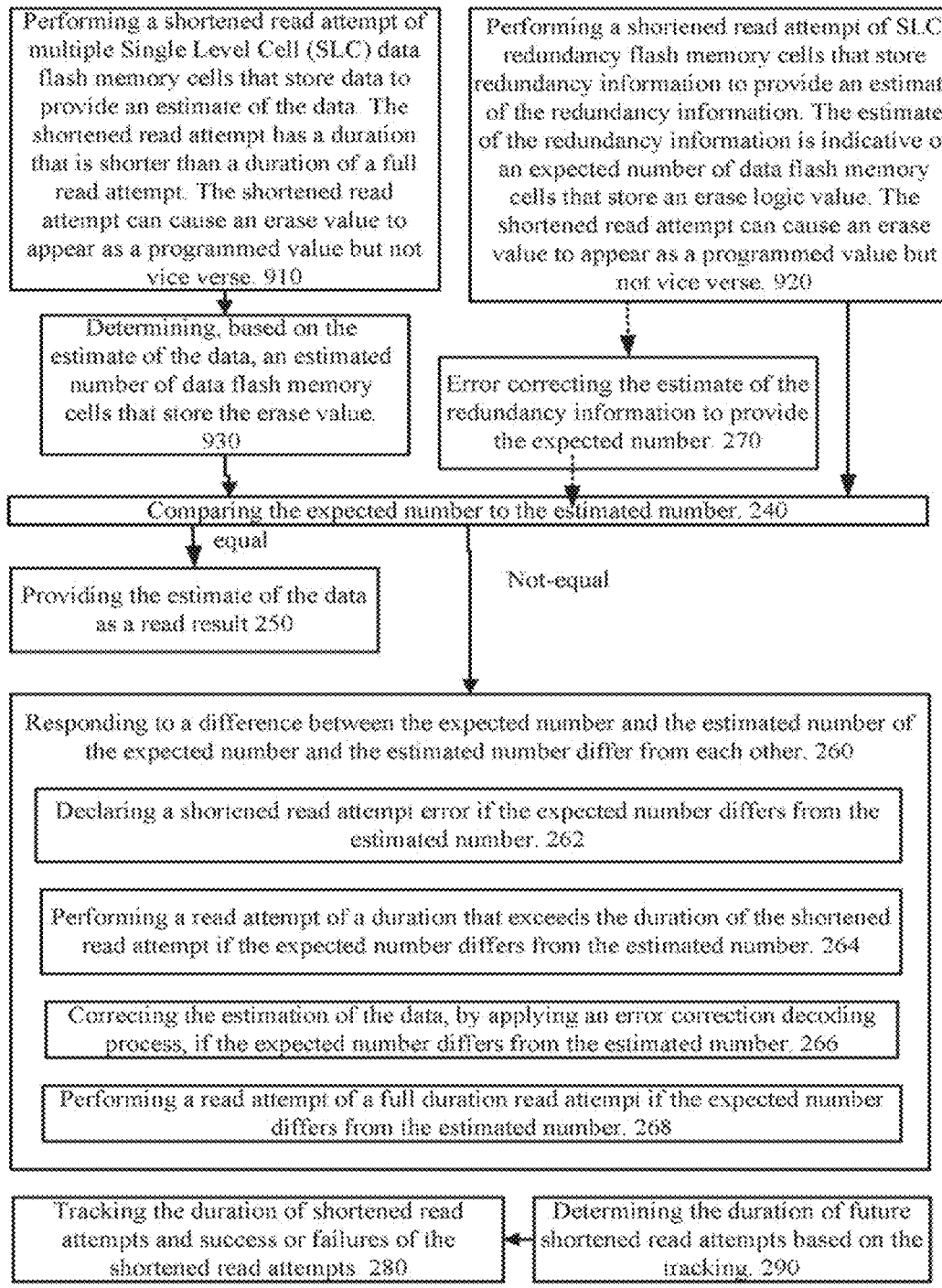
FIG. 9 illustrates a method according to an embodiment of the invention.

FIG. 9 illustrates a method 900 for reading a Single Level Cell (SLC) flash memory cell array, according to an embodiment of the invention.

An SLC flash memory cell can store an erase value or a programmed value. With this, estimation errors due to shortened read, which can only result in an over-estimation of the amount of charge stored in a cell, result in an increase in the number of 0s in the estimated data relative to the actual. In the signature, whose actual value is the number of 0s in the data, the unidirectional estimation errors can only cause the estimated value of the signature to be lower than its actual value; i.e., the number of 0s in the data according to the estimated signature can never be greater than that in the actual data, so the estimated signature can only match the estimated data if neither estimate was erroneous.

Method 900 starts by stages 910 and 920.

Stage 910 includes performing a shortened read attempt of multiple Single Level Cell (SLC) data flash memory cells that store data, to provide an estimate of the data. The shortened read attempt has a duration that is shorter than the duration of a full read attempt. The shortened read attempt can cause an erase value to appear as a programmed value but not vice verse. Thus, the estimate of the stored data can indicate that more data flash memory cells store the programmed value than the actual amount of such data flash memory cells.

Stage 920 includes performing a shortened read attempt of SLC redundant flash memory cells that store redundant information to provide an estimate of the redundant information. The estimate of the redundant information is indicative of an expected number of data flash memory cells that store an erase logic value. The shortened read attempt can cause an erase value to appear as a programmed value but not vice verse. Because the redundant information is indicative of the flash memory cells that store the erase value then errors introduced by the shortened read attempt will cause the estimated number of flash memory cells that store the programmed value to be larger than the actual amount of such data flash memory cells.

Thus, the shortened read attempt introduces errors that affect the estimated number and the expected number to change in different manners—in opposite directions.

Stage 910 is followed by stage 920 of determining, based on the estimate of the data, an estimated number of data flash memory cells that store the erase value.

Stage 920 and 930 are followed by stage 240 of comparing the expected number to the estimated number.

Stage 240 is followed by stage 250 of providing the estimate of the data as a read result if the expected number and the estimated number equal each other.

Stage 240 is followed by stage 260 of responding to a difference between the expected number and the estimated number of the expected number and the estimated number differ from each other.

Stage 260 may include at least one of the following:

a. Stage 262 of declaring a shortened read attempt error if the expected number differs from the estimated number.
b. Stage 264 of performing a read attempt of a duration that exceeds the duration of the shortened read attempt if the expected number differs from the estimated number.
c. Stage 266 of correcting the estimation of the data, by applying an error correction decoding process, if the expected number differs from the estimated number.
d. Stage 268 of performing a full duration read attempt if the expected number differs from the estimated number.

If, for example, the method 200 is applied on single level cells (SLC) flash memory cells then the certain logic value is an erase logic value, the first direction is the direction of increase and the second direction is the direction of decrease.

If, for example, the flash memory cells are multiple level cells (MLC) that are to be read by a set of reference voltages, then the stages of method 200 can be repeated for each reference voltage.

According to an embodiment of the invention, method 900 can include a stage 270 of error correcting the estimate of the signature to provide the expected number. Stage 270 follows stage 920 and precedes stage 240. According to yet another embodiment of the invention, method 900 can include stage 272 of correcting the estimate of data. Thus, stage 900 can include either one of stage 270 and 272, both or none of them.

According to an embodiment of the invention, method 200 can include stage 280 of tracking the duration of shortened read attempts and success or failures of the shortened read attempts. The tracking can be done per flash memory page, block or any other portion or for the entire flash memory cell array. The results of the tracking can be used for determining (stage 290) the duration of future shortened read attempts (per flash memory page, block, and any portion of the flash memory cell array or per the entire flash memory cell array). The tracking can take into account the state of the flash memory cell array or a portion thereof including read erase cycle count, life period and the like, when determining the duration of the next shortened read attempt. It is expected that the duration of the shortened read attempt will increase as the read erase cycle count rises, as more errors are expected to be introduced during the shortened read attempt.

It is noted that the reading of the accumulated read-length information on a per-access basis is likely to more than offset the benefit of the shortened read. Therefore, one can, upon turning on the system, and especially if this information is not very fine grain, read this information once into regular memory and look it up there. This regular memory (DRAM or SRAM) can be either in the computer or may be memory that is part of the Flash controller (can be in the Flash chip or external to it). This is the same controller that executes the various described stages to access the flash cells.

Figure 3:
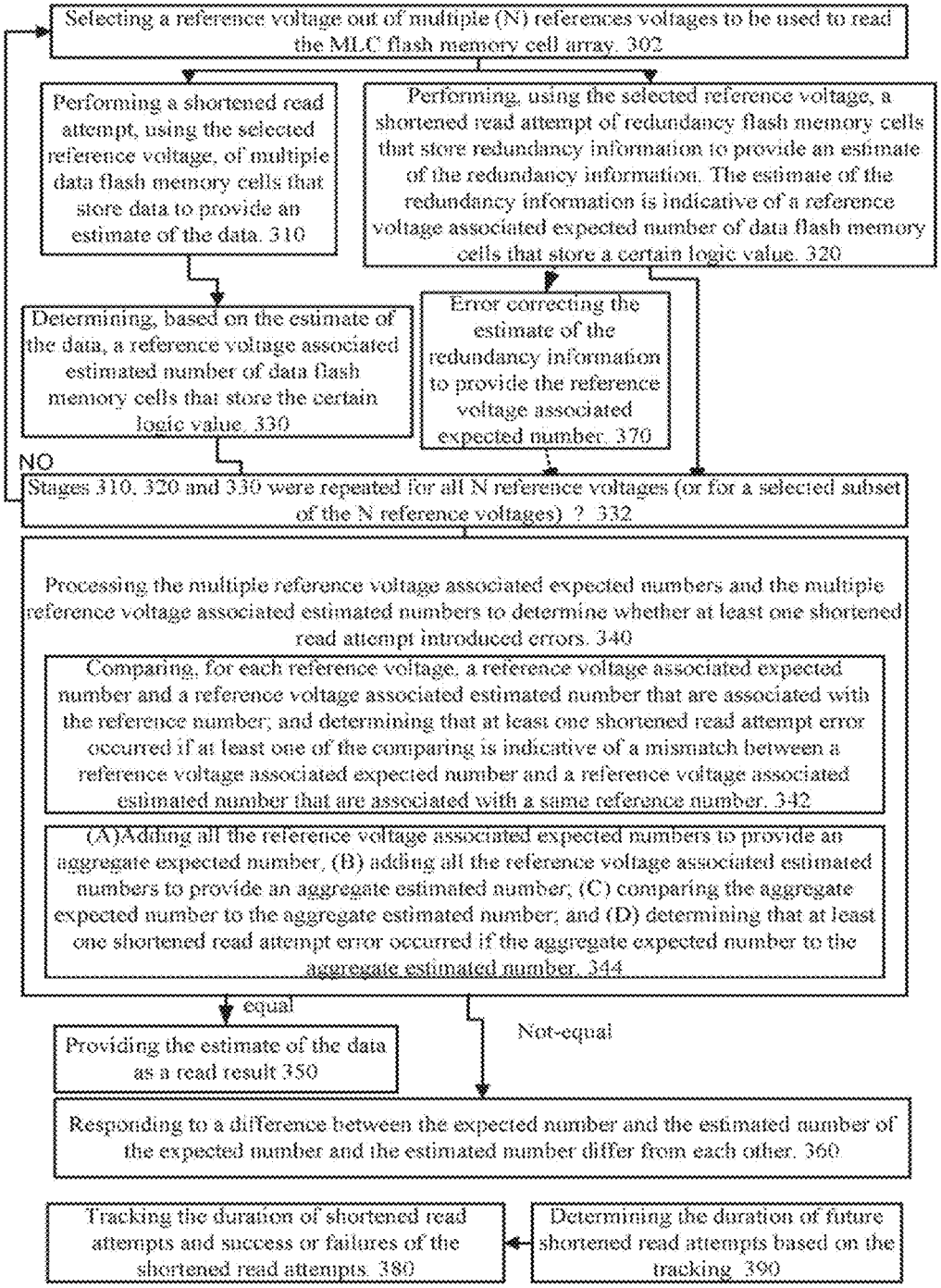
FIG. 3 illustrates a method according to another embodiment of the invention.

FIG. 3 illustrates method 300 for reading a Multiple Level Cell (MLC) flash memory cell array, according to an embodiment of the invention.

Method 300 starts by stage 302 of selecting a reference voltage out of multiple (N) reference voltages to be used to read the MLC flash memory cell array. If each MLC flash memory cell can store K bits then the number of reference voltages (N) equals $2^K$ {(2 to the power K)−1}. For example, an MLC flash memory cell that stores three bits can be read by applying seven different reference voltages. (In general, the number of charge levels need not be a integer power of two, and the number of bits per cell thus need not be an integer. The invention operates for any number of charge levels.)

Stage 302 is followed by stage 310 and 320.

Stage 310 includes performing a shortened read attempt, using the selected reference voltage, of multiple data flash memory cells that store data to provide an estimate of the data.

Stage 320 includes performing, using the selected reference voltage, a shortened read attempt of redundant flash memory cells that store redundant information to provide an estimate of the redundant information.

The redundant information may be indicative of a number of flash memory cells that once read by using a reference voltage will appear to be storing a certain logic value. This number is referred to as reference-voltage-associated expected number of data flash memory cells that store a certain logic value. For example, the numbers of such cells whose threshold voltages exceed each of the said N reference voltages.

The shortened read attempt may be expected to introduce at least zero errors to the estimate of data along a first direction and to introduce at least zero errors to the estimate of the redundant information along a second direction. The second direction differs from the first direction. The first and second directions can be either a direction of increase or a direction of decrease.

The estimate of the data may represent an estimated amount of charge being stored in the multiple data flash memory cells. The data may represent an actual amount of charge being stored at the multiple data flash memory cells. In a flash memory cell array the actual amount of charge does not exceed the estimated amount of charge.

Stage 310 is followed by stage 330 of determining, based on the estimate of the data, a reference-voltage-associated estimated number of data flash memory cells that store the certain logic value.

Stage 330 can be followed by stage 332 determining whether stages 310, 320 and 330 were repeated for all N reference voltages (or for a selected sub-set of the reference voltages—in case only one or some reference-voltages should be read). If the answer is positive then stage 332 is followed by stage 340, else stage 332 is followed by stage 310.

Stage 340 includes processing the multiple reference-voltage-associated expected numbers and the multiple reference-voltage-associated estimated numbers (all obtained during the N repetitions of stages 310, 320 and 330 or a smaller number of repetitions—if only some of the reference voltages should be applied) to determine whether at least one shortened read attempt introduced errors.

Stage 340 may include stage 342 of comparing, for each reference voltage, a reference-voltage-associated expected number and a reference-voltage-associated estimated number that are associated with the reference voltage; and determining that at least one shortened read attempt error occurred if at least one of the comparing is indicative of a mismatch between a reference-voltage-associated expected number and a reference-voltage-associated estimated number that are associated with a same reference voltage.

Stage 340 may include stage 344 of: (a) adding all the reference-voltage-associated expected numbers to provide an aggregate expected number; (b) adding all the reference-voltage-associated estimated numbers to provide an aggregate estimated number; (c) comparing the aggregate expected number to the aggregate estimated number; and (d) determining that at least one shortened read attempt error occurred if the aggregate expected number to the aggregate estimated number.

Stage 340 may be followed by stage 350 of providing the estimate of the data as a read result if the expected number and the estimated number equal each other.

Stage 340 is followed by stage 360 of responding to a difference between the expected number and the estimated number if the expected number and the estimated number differ from each other.

Stage 360 can include responding to one or more differences between any pair of reference-voltage-associated expected number and a reference-voltage-associated estimated number that are associated with a same reference voltage.

Stage 360 may be equivalent to stage 260 of FIG. 2 and may include at least one of the following:
a. Declaring a shortened read attempt error if the expected number differs from the estimated number.
b. Performing a read attempt of a duration that exceeds the duration of the shortened read attempt if the expected number differs from the estimated number.
c. Correcting the estimation of the data, by applying an error correction decoding process, if the expected number differs from the estimated number.
d. Performing a full duration read attempt if the expected number differs from the estimated number.

It is noted that any of the responses (a)-(d) (or any other response) can be applied to each of the reference voltages that were applied during the different repetitions of stage 310-330 (N or fewer), but can be applied only to a part of these reference voltages—for example, for at least those reference voltages that are associated with a pair of reference-voltage-associated expected number and a reference-voltage-associated estimated number that differ from each other. Yet as another example, even if the determination is not based on the pairs of reference-voltage-associated expected number and a reference-voltage-associated estimated number (but rather on the aggregate expected number and the aggregate estimated number) the process can select for which reference voltages to perform at least one response out of (a)-(d) (or any other response). This selection can be random, based on previous read attempts, based on an estimate of error prone reference voltages and the like.

According to an embodiment of the invention, method 300 can include stage 380 of tracking the duration of shortened read attempts and success or failures of the shortened read attempts. The tracking can be done per flash memory page, block or any other portion or for the entire flash memory cell array. The results of the tracking can be used for determining (stage 390) the duration of future shortened read attempts (per flash memory page, block, or any portion of the flash memory cell array or per the entire flash memory cell array). The tracking can take into account the state of the flash memory cell array or a portion thereof including read erase cycle count, life period and the like, when determining the duration of the next shortened read attempt. It is expected that the duration of the shortened read attempt will increase as the read erase cycle count rises, as more errors are expected to be introduced during the shortened read attempt. The tracking can also be done per one or more reference voltage.

It is noted that either one of methods 200 and 300 can be applied during writing. A writing process may include performing a write attempt and then performing a read flash memory. It is noted that at least some read attempts that are executed during the write process can be shortened read attempts.

Figure 4:
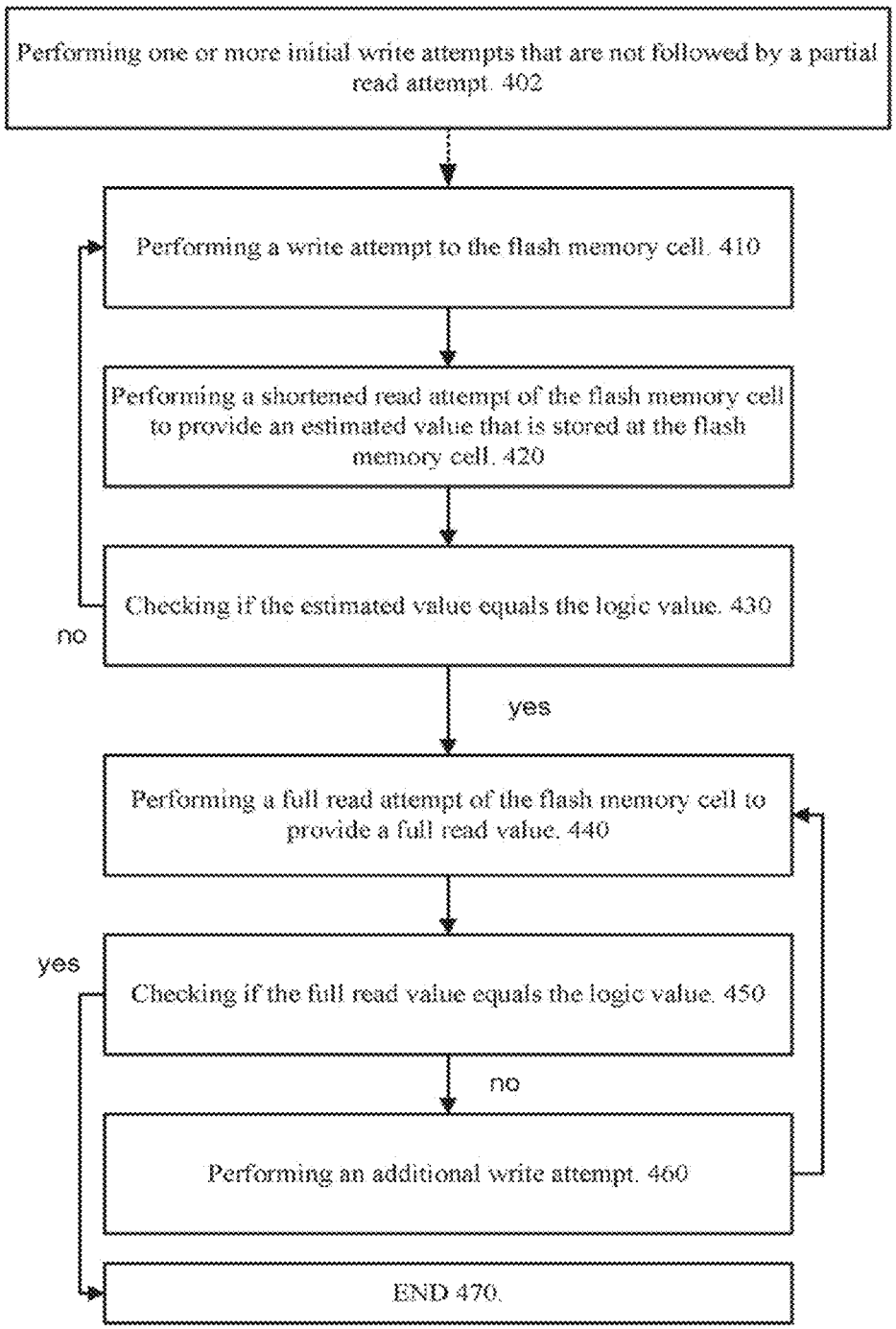
FIG. 4 illustrates a method according to a further embodiment of the invention.

FIG. 4 illustrates a method 400 for writing a logic value data to a flash memory cell, according to an embodiment of the invention. This logic value can be regarded as a target logic value or a desired logic value.

It is noted that, just like in SLC, the estimation error can only be in the direction of believing that a cell is charged whilst it is not, in MLC it can only be in the direction of estimating the amount of charge in a cell to be greater than the actual amount. Therefore, a system according to this invention will not err in the direction of overcharging a cell.

It is also noted that charging is usually carried out in increments. When it is determined that the (target) logic level has not been reached (be it using a short read or a full one), another write increment is made.

Method 400 may start by stage 410 of performing a write attempt to the flash memory cell. Stage 410 is followed by stage 420 of performing a shortened read attempt of the flash memory cell to provide an estimate of the current threshold voltage of the flash memory cell that is being written to. (This value is affected both by the amount of charge that has actually been "pumped" into the cell, by its internal parameter, by inter-cell coupling parameters and by the current charge in adjacent cells. It is imperative not to overcharge a cell, as incremental removal of charge or even erasure of an individual cell is impossible.)

The estimated value represents an estimated amount of charge being stored in the flash memory cell. The logic value represents an actual amount of charge being stored in the data flash memory cell. According to an embodiment of the invention the actual amount of charge does not exceed the estimated amount of charge.

Stage 420 is followed by stage 430 of checking if the estimated value equals the logic value. If the estimated value did not reach the logic value then stage 430 is followed by stage 410. If the estimated value reaches the (target) logic value then stage 430 is followed by stage 440.

Stage 440 includes performing a full read attempt of the flash memory cell to provide a full read value.

Stage 440 is followed by stage 450 of checking if the full read value equals the logic value. If the full read value did not reach the logic value then stage 450 is followed by stage 460 of performing an additional write attempt and jumping to stage 440.

If the full read value equals the logic value then the writing process is completed, as illustrated by END stage 470.

According to an embodiment of the invention the writing process can start by performing (stage 402) one or more initial write attempts that are not followed by a shortened read attempt. It is assumed that such one or more initial write attempt will not complete the writing process and thus they are not followed by a shortened read attempt.

Method 400 can be executed for multiple flash memory cells, either in parallel or in serial manner. It is noted that method 400 can be applied on data flash memory cells for storing data and on redundant information flash memory cells for storing redundant information.

Figure 5:
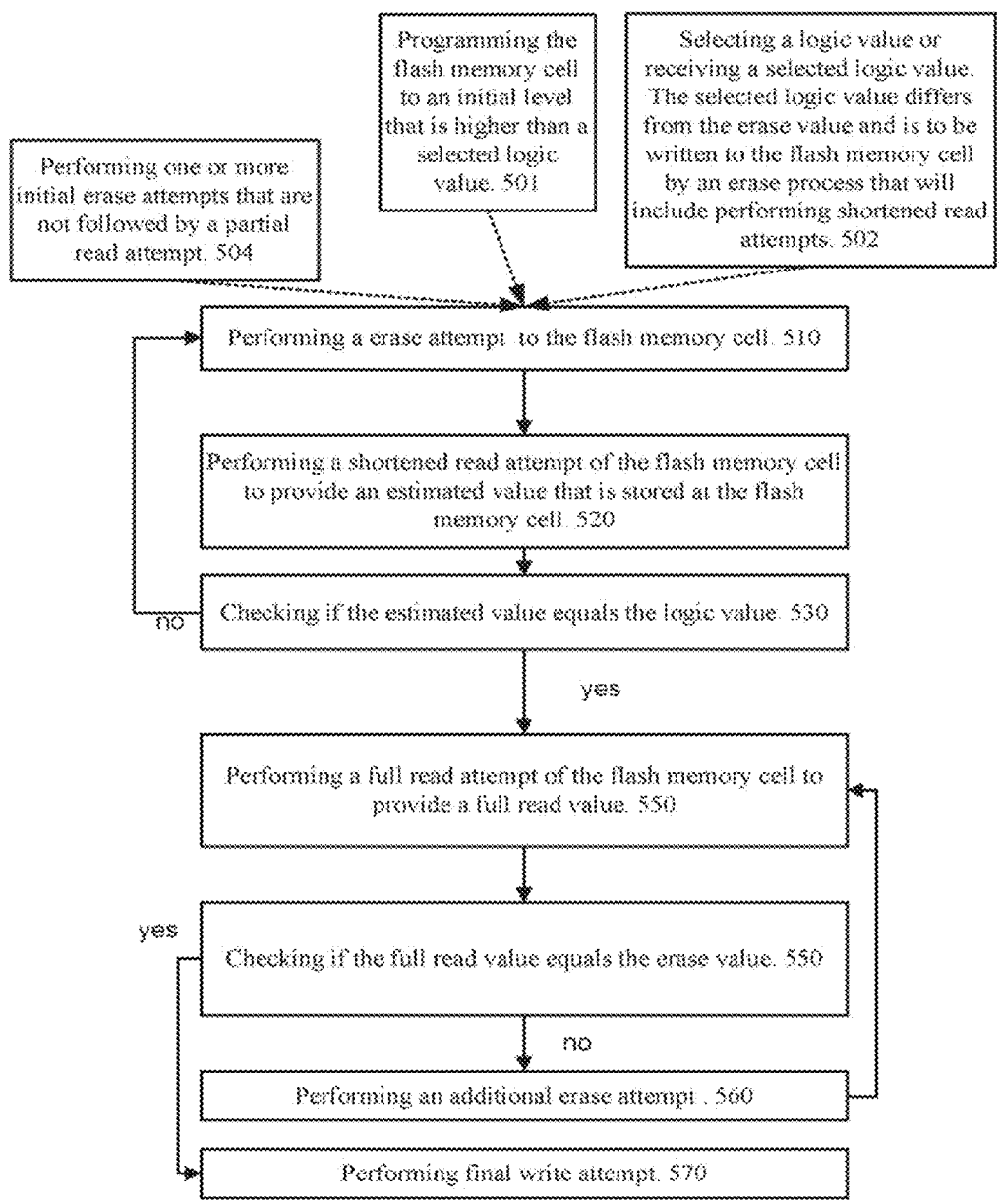
FIG. 5 illustrates a method according to a further embodiment of the invention.

FIG. 5 illustrates a method 500 for erasing a flash memory cell, according to an embodiment of the invention.

The erasure of the flash memory cell includes writing an erase value to the flash memory cell. Typically, all the flash memory cells to be erased are first (a) programmed to a certain logic value (for example—the highest logic value) and after being programmed to that certain logic value are (b) programmed to store the erase value. The programming can be executed in any manners mentioned above, by using one or more shortened read operations, full read operations and the like. Various embodiments of executing the programming (b) to the erase value care listed below. It is noted that the programming (b) to the erase value can include programming the erase cells to a charge level that is lower than a desired erase level and then adding charge by performing one or more write attempts. The latter can involve partial read attempts or full read attempts.

Method 500 starts by stage 502 of selecting a logic value or receiving a selected logic value. The selected logic value differs from the erase value and is to be written to the flash memory cell by a writing process that will include performing shortened read attempts.

If, for example, the shortened read attempt can induce errors that will result in an excess estimation of the charge stored at the flash memory cell, the logic value should be selected to compensate for the excess estimation in the sense that once the shortened read attempt will indicate that the charge stored in the flash memory cell represents the logic value—the flash memory cell will store more charge than the charge associated with the erase value—to prevent excessive writing attempts to a flash memory cell that has been already erased.

Stage 502 is followed by stage 510 of performing a write attempt to the flash memory cell.

Stage 510 is followed by stage 520 of performing a shortened read attempt of the flash memory cell to provide an estimated value that is stored at the flash memory cell.

Stage 520 is followed by stage 530 of checking if the estimated value equals the logic value. If the estimated value did not reach the logic value then stage 530 is followed by stage 510. If the estimated value reaches the logic value then stage 530 is followed by stage 540.

Stage 540 includes performing a full read attempt of the flash memory cell to provide a full read value.

Stage 540 is followed by stage 550 of checking if the full read value equals the erase value. If the full read value did not reach the erase value then stage 550 is followed by stage 560 of performing an additional write attempt and jumping to stage 540.

If the full read value equals the erase value then the writing process is completed, as illustrated by END stage 570.

According to an embodiment of the invention, the writing process can start by performing (stage 504) one or more initial write attempts that are not followed by a shortened read attempt. It is assumed that such one or more initial write attempt will not complete the erasing process and thus they are not followed by a shortened read attempt.

It is noted that an erase process can start by writing the highest possible value to the flash memory cells. This write process can involve shortened read operations.

It is noted that any of the mentioned above methods can be executed in addition to any error correction coding, error detection coding, that may be applied to amend errors that are not contributed by the shortened read attempts.

Figure 6:
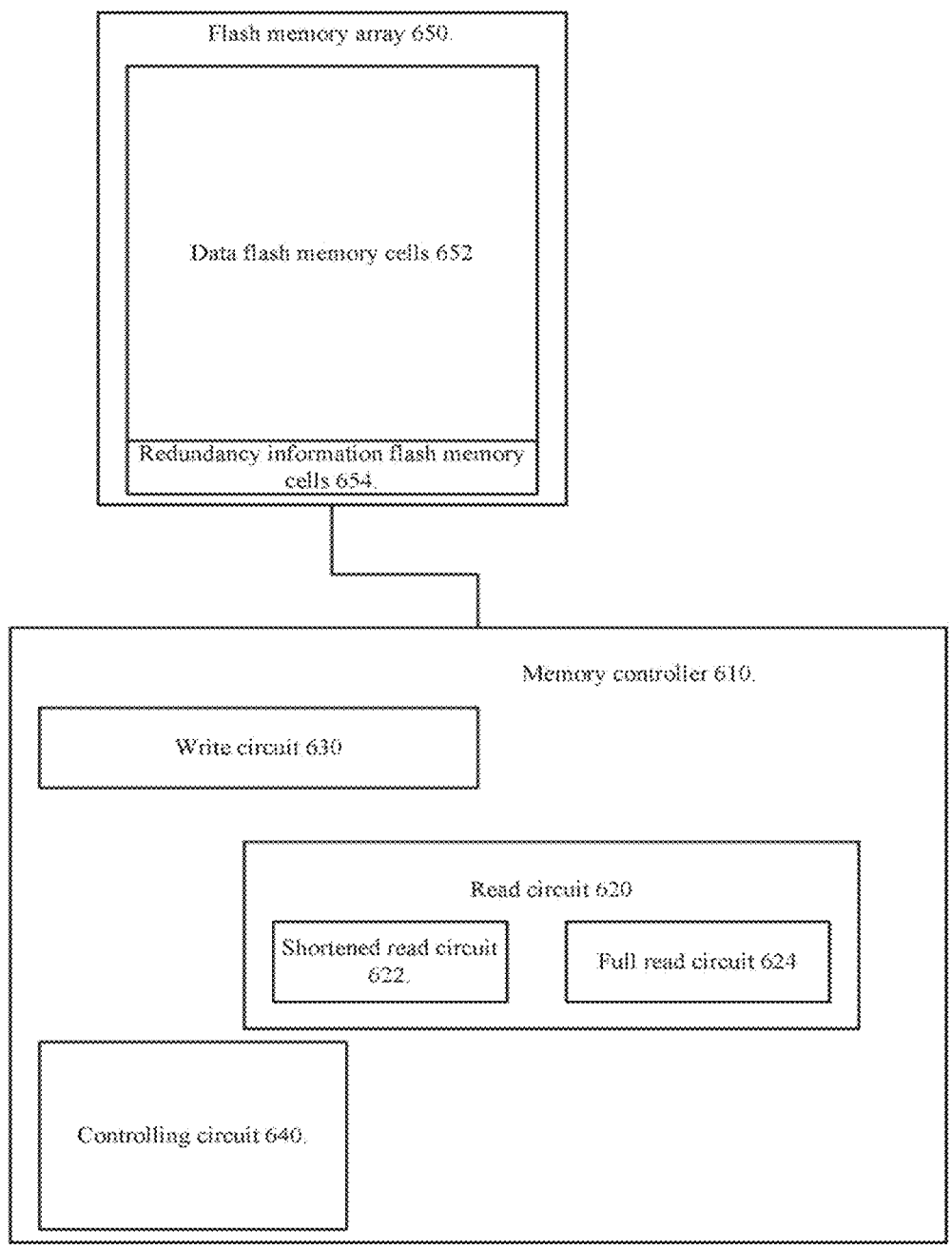
FIG. 6 illustrates a device according to an embodiment of the invention.

FIG. 6 illustrates a device 600 according to an embodiment of the invention. The device can be a memory controller, a combination of a memory controller and a flash memory cell array, can include the memory controller, and can include the combination of a memory controller and a flash memory cell array.

FIG. 6 illustrates device 600 as including a memory controller 610 and a flash memory cell array 650 that are coupled to each other. The flash memory cell array 650 can include flash memory cells that store data (and are referred to as data flash memory cells) 652 and flash memory cells that store redundant information (and are referred to as redundant information flash memory cells) 654. The memory controller 610 and a flash memory cell array 650 can be included in the same integrated circuit, or in different integrated circuits.

Device 600 can execute any of the mentioned above methods and any combination of any stages of any of the mentioned above methods.

The memory controller 610 includes a read circuit 620, a write circuit 630, a controlling circuit 640 and an erase circuit 660. It is noted that the read module 620 and the write module can have their own controlling circuits and that the read module can be separated from the write module or be integrated with the write module. Each of these circuits can be integrated with the flash memory array.

The flash memory controller 610 can be embedded into the flash memory cell array 650. Additionally or alternatively, one or more of circuits 620, 630, 640 and 660 can be integrated with the flash memory cell array 650.

The read circuit 620 can be arranged to perform full read attempts and shortened read attempts. It is illustrated as including a full read circuit 624 and a shortened read circuit 622—although both circuits can be integrated (or their functionality can be performed by a single circuit).

The shortened read circuit 622 may be arranged to perform a shortened read attempt of multiple data flash memory cells that store data to provide an estimate of the data; wherein the shortened read attempt has a duration that is shorter than a duration of a full read attempt; and perform a shortened read attempt of redundant flash memory cells that store redundant information to provide an estimate of the redundant information; wherein the estimate of the redundant information is indicative of an expected number of data flash memory cells that store a certain logic value.

The controlling circuit 640 can control the read module 620, the write module 640 and can de arranged to perform multiple determinations. For example, the controlling circuit may be arranged to determine, based on the estimate of the data, an estimated number of data flash memory cells that store the certain logic value; compare the expected number to the estimated number; and provide the estimate of the data as a read result if the expected number and the estimated number equal each other. Wherein errors induced by any shortened read attempt affect the expected number and the estimated number at different manners.

The write circuit 630 and the shortened read circuit 622 can be arranged to repetitively perform (a) a write attempt (by the write circuit) to the flash memory cell and (b) a shortened read attempt (by the shortened read circuit) of the flash memory cells to provide an estimated value that is stored at the flash memory cell, until (can be determined by the controlling circuit 640) the estimated value equals the logic value. The full read circuit 624 can be arranged to perform a full read attempt of the flash memory cell, if the estimated value equals the logic value, to provide a full read value. The controlling circuit 640 can be arranged to determine that the writing of the logic value is completed if the full read value equals the logic value.

The erase circuit 660 can be arranged to erase flash memory cells. The erase circuit 660 can apply shortened read attempts and full read attempts during the erasing process.

Figure 7:
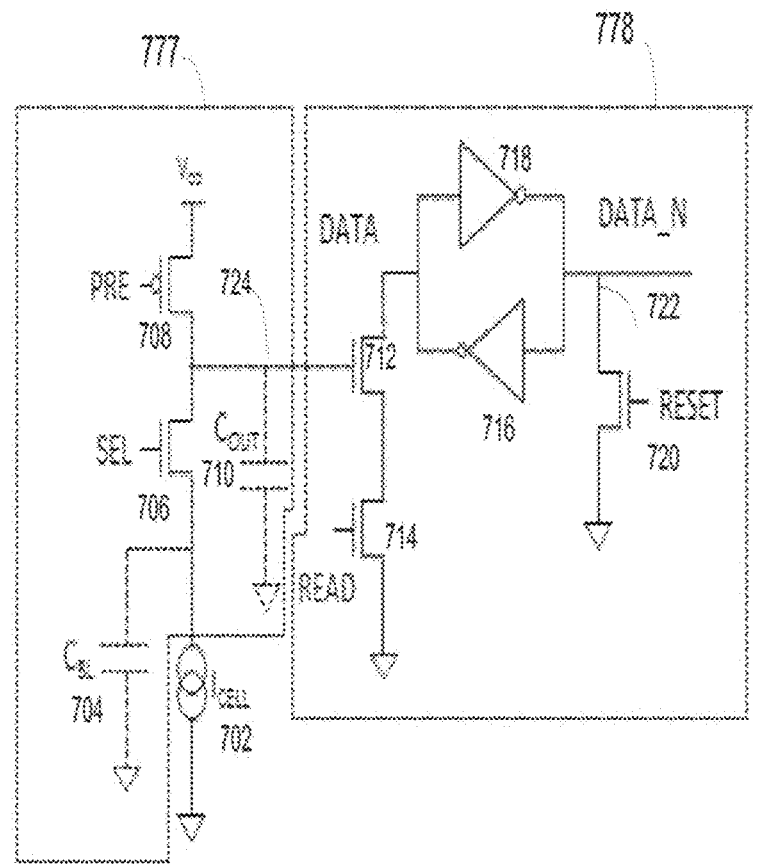
FIG. 7 illustrates a model of a prior art NAND flash memory cell array according to an embodiment of the invention.

A model 700 of an SLC NAND flash read path is depicted in FIG. 7. The flash memory cell is represented by box 777. Readout circuitry is represented by box 788.

A NAND string is modeled as current source 702.

During a read attempt, a reference voltage (also referred to as read voltage) is applied to cell's gate, whereas the other cells sharing the same string are given a different other voltage and act as pass transistors. If the flash cell is programmed then the NAND string does not conduct current. Else, it will conduct current up to the maximum amount it can absorb (typically 250 nA).

The read attempt of NAND flash includes two phases: a pre-charge phase and an evaluation phase. In the pre-charge phase, the gate of the SEL transistor (NMOS) 706 is biased to $V_1$ (typically 2 v), and the gate of the PRE transistor 708 (PMOS) is kept grounded. As a result, $C_{out}$ 710 (typically 40 fF) that represents the capacitance of the output node 724 is charged to $V_{DD}$ and the bitline parasitic capacitance, $C_{BL}$ 704 (typically 2-3 pF) is charged to $V_1$-$V_{th.sel}$ (where $V_{th.sel}$ is the threshold voltage of SEL transistor 706). At the end of the charge, the PRE and SEL transistors 708 and 706 are switched off, while output node 724 and the BL node (defined between $I_{Cell}$ 702 and SEL transistor 706) are floating, pre-charged at their initial voltage values. Next starts the evaluation phase, over $T_{VAL}$ time period. During $T_{VAL}$, if the Flash cell is erased then $I_{CELL}$>0 A and the bitline (702) will be discharged. Else, the bitline will retain its initial value.

After $T_{VAL}$ time, the gate of the SEL transistor 706 is biased to $v_2$ ($V_2$<$V_1$, typically 1.5 v). If the bitline was discharged then $V_2$-$V_{BL}$>$v_{th.sel}$, so that the SEL transistor 706 is switched on, and the voltage of the output node 724 will match the bitline voltage $V_{out}$=$V_{BL}$. Else, the bitline was not discharged, and the output node 724 will keep its initial value $V_{out}$=$V_{DD}$. The value of the output node 724 is converted to compatible logic levels and latched by latches 716 and 718. The READ transistor 714 is switched on. If the value of the output node 724 is $V_2$-$V_{th.sel}$ or less, the output signal DATA output at node 722 is 1. Else, DATA signal is 0 (prior to read, the RESET transistor 720 is on which initialize DATA signal to be 1).

Read time latency is 25 µs max. The pre-charge and evaluation stages last for 5 µs and 10 µS respectively. The pre-charge time consists of charging (e.g. 32 k) bitlines, each bitline is about 2-3 pF, and the string can absorb current of (100-300 nA). The evaluation phase consists of waiting $T_{EVAL}$ time, and reading the output node. The $T_{EVAL}$ consists of:

$$T_{EVAL} = \frac{C_{BL}(V_1 - V_2)}{I_{CELL}}$$

Where ($V_1$-$V_2$) are between 300-600 mV.

Read is divided into two stages: pre-charge, where PRE transistor 708 is at ground and the SEL transistor 706 is open with $v_1$, so that $C_{BL}$ 704 and $C_{OUT}$ 710 are charged. Evaluation phase where PRE transistor 708 is off, and SEL transistor 706 is biased with $V_2$>$V_1$ such that if the cell is erased, i.e. $I_{CELL}$>0, $C_{BL}$ 704 is discharged. In this phase, if $V_{BL}$<$V_2$-$V_{th,SEL}$ then $V_{OUT}$=$V_{BL}$ and the sensed data is 1. Else, the sensed data is 0.

For optimal performance, the difference between $V_1$ and $V_2$ needs to be minimized. However, due to disturbs such as spurious leakage currents or disturbs on the bitline, the voltage difference is between 300-500 mV.

Currently, worst case conditions are considered when specifying $T_{EVAL}$ for read; that is, highest $C_{BL}$, lowest $I_{CELL}$, and $V_{BL}$ noise that may increase $V_{BL}$ by some magnitude. Also, spurious noise of leakage currents is considered.

Note that when the programming of (writing to) a cell has been completed, it is no longer required to read it again and again in order to have its level verified while other cells in the page have charge being added to them. It is therefore optionally possible to implement a flag that indicates that a page's programming has been completed, so as to cease the process.

For each evaluation time, we assign an error probability. The error probability depends on $C_{BL}$, $I_{CELL}$, ($V_1$-$V_2$), and bitline and leakage current noise. Since that discharging is exponential, the string's ability to absorb current is fully utilized.

It is observed that read errors are uni-directional. The short read concept hinges on the fact that whenever a cell was programmed (in charged state), the read output will always be correct. In case that the cell is erased, if evaluation time is sufficient then it would be read as 1, a premature assessment may cause it to be sensed as 0.

Figure 8:
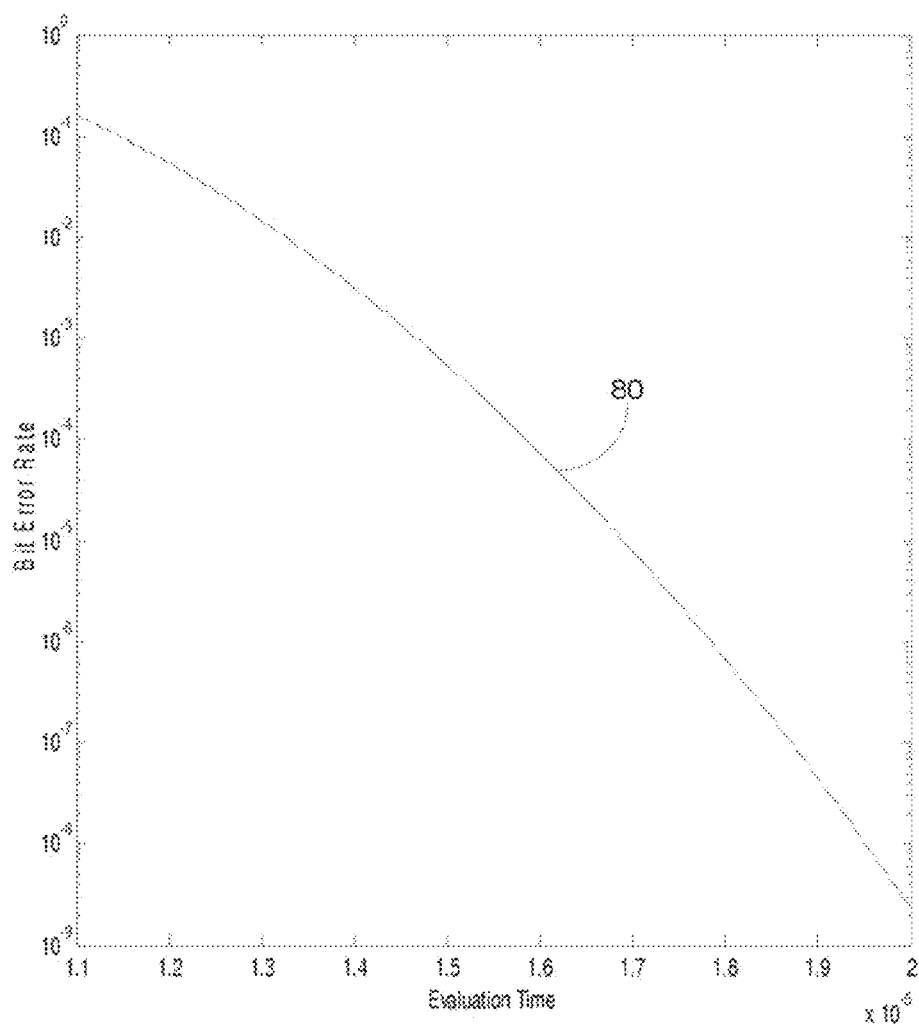
FIG. 8 illustrates a relationship between a duration of a shortened read attempt and error rates according to an embodiment of the invention.

The bit error rate as a function of the evaluation time was simulated with the following assumptions: the time for page read has a Gaussian distribution with µ=8 µs, and σ=2 µs. The simulated BER is shown by curve 80 of FIG. 8.

Current read evaluation time of 18 µs results in a read error every million reads (BER of $10^{-6}$). For example, reducing the evaluation time to 13 µs, about 30% improvement, would increase the BER to $10^{-2}$.

Figure 10:
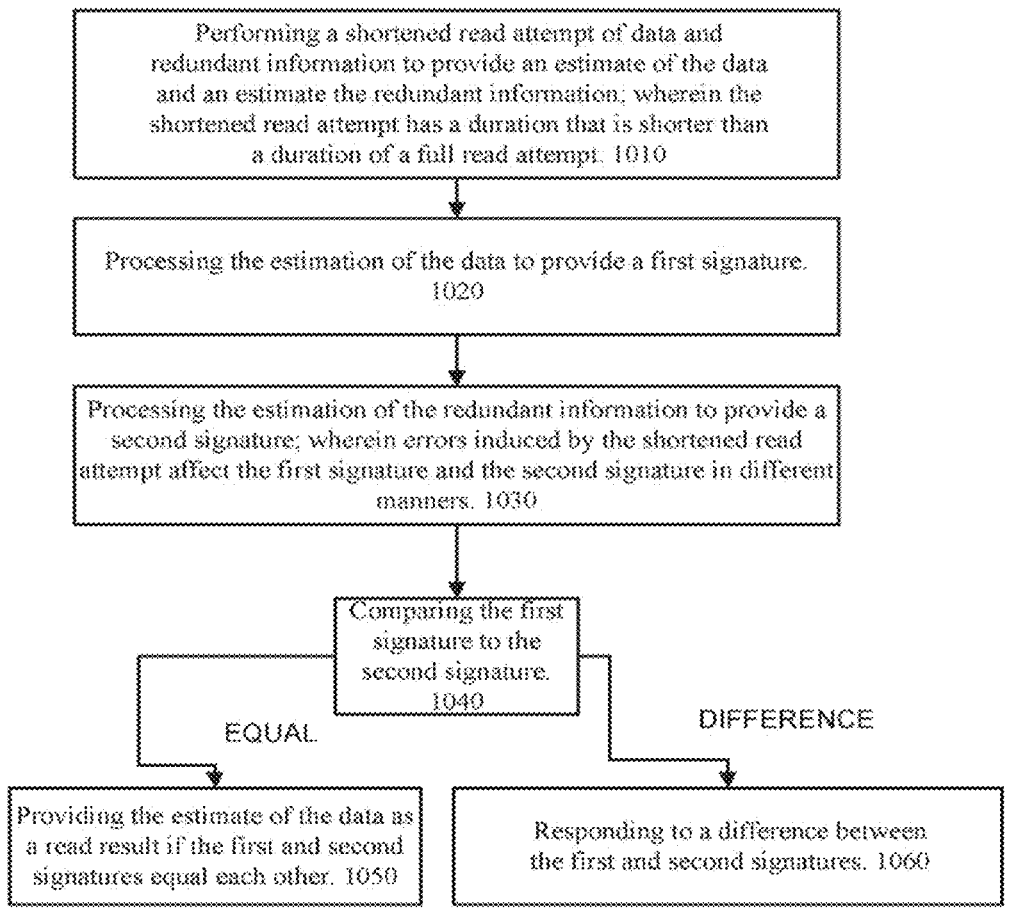
FIG. 10 illustrates a method according to an embodiment of the invention.

FIG. 10 illustrates method 1000 according to an embodiment of the invention.

Method 1000 may start by stage 1010 of performing a shortened read attempt of data and redundant information to provide an estimate of the data and an estimate the redundant information; wherein the shortened read attempt has a duration that is shorter than a duration of a full read attempt.

Stage 1010 is followed by stage 1020 of processing the estimation of the data to provide a first signature.

Stage 1020 is followed by stage 1030 of processing the estimation of the redundant information to provide a second signature; wherein errors induced by the shortened read attempt affect the first signature and the second signature in different manners.

Stage 1030 is followed by stage 1040 of comparing the first signature to the second signature.

Stage 1040 is followed by stage 1050 providing the estimate of the data as a read result if the first and second signatures equal each other.

Stage 1040 is also followed by stage 1060 to responding to a difference between the first and second signatures.

Stage 1060 may include attempting to correct at least one of the estimation of the data and the estimation of the redundant information if the first and second signatures differ from each other.

Stage 1010 may include performing a shortened read attempt of multiple data flash memory cells that store data to provide an estimate of the data; and performing a shortened read attempt of redundant flash memory cells that store redundant information to provide an estimate of the redundant information. Wherein the second signature is indicative of an expected number of data flash memory cells that store a certain logic value, and wherein the first signature is indicative of an estimated number of data flash memory cells that store the certain logic value.

Stage 1040 may include comparing the expected number to the estimated number; and wherein the method comprises providing the estimate of the data as a read result if the expected number and the estimated number equal each other; wherein errors induced by any shortened read attempt affect the expected number and the estimated number in different manners.

Figure 11:
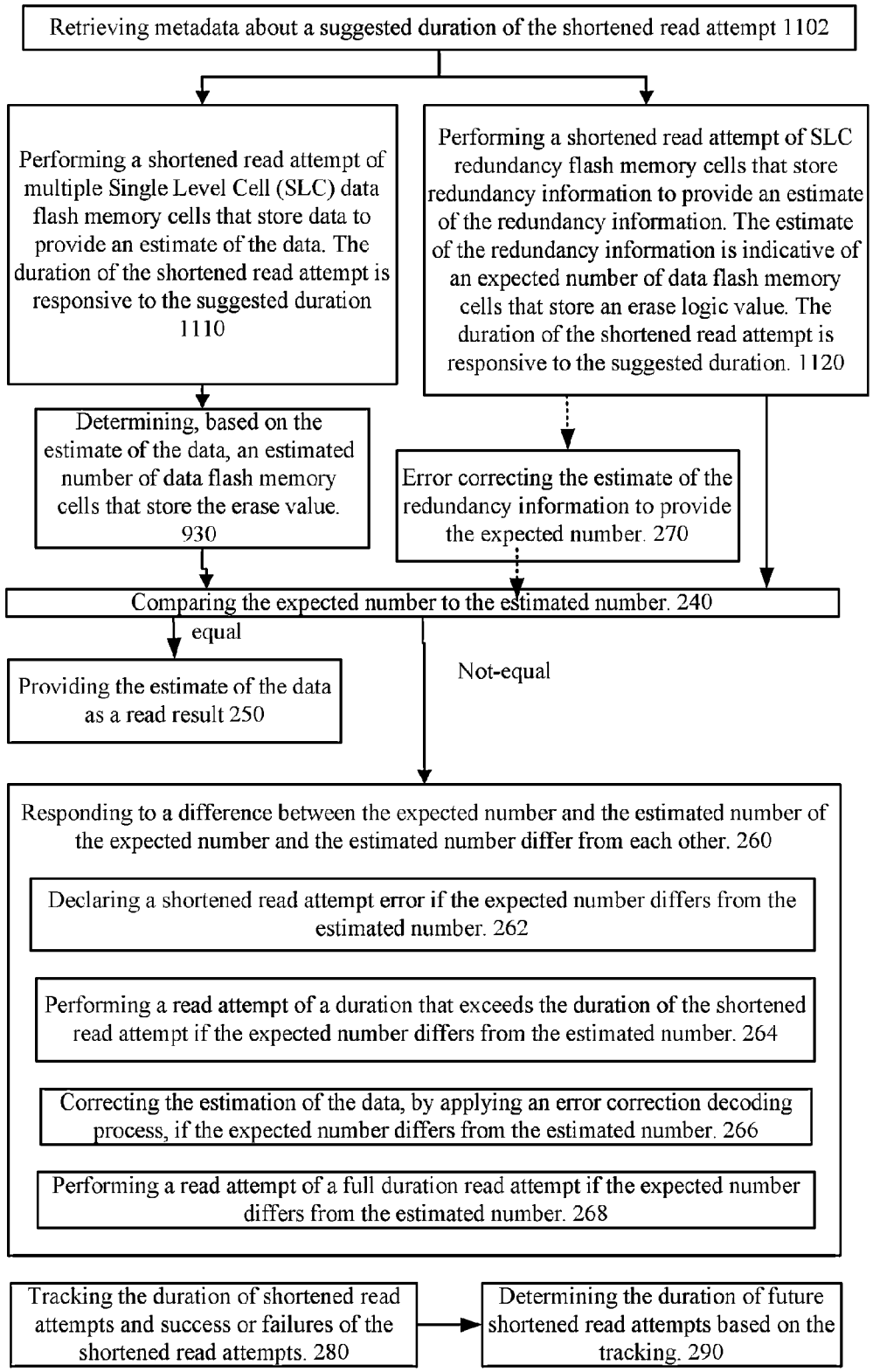
FIG. 11 illustrates a method according to an embodiment of the invention.
Figure 12:
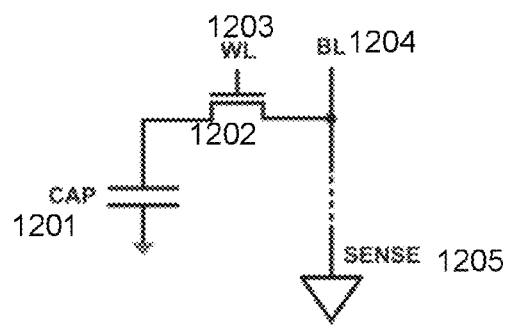
FIGS. 12-13 illustrate prior art DRAM modules.
Figure 13:
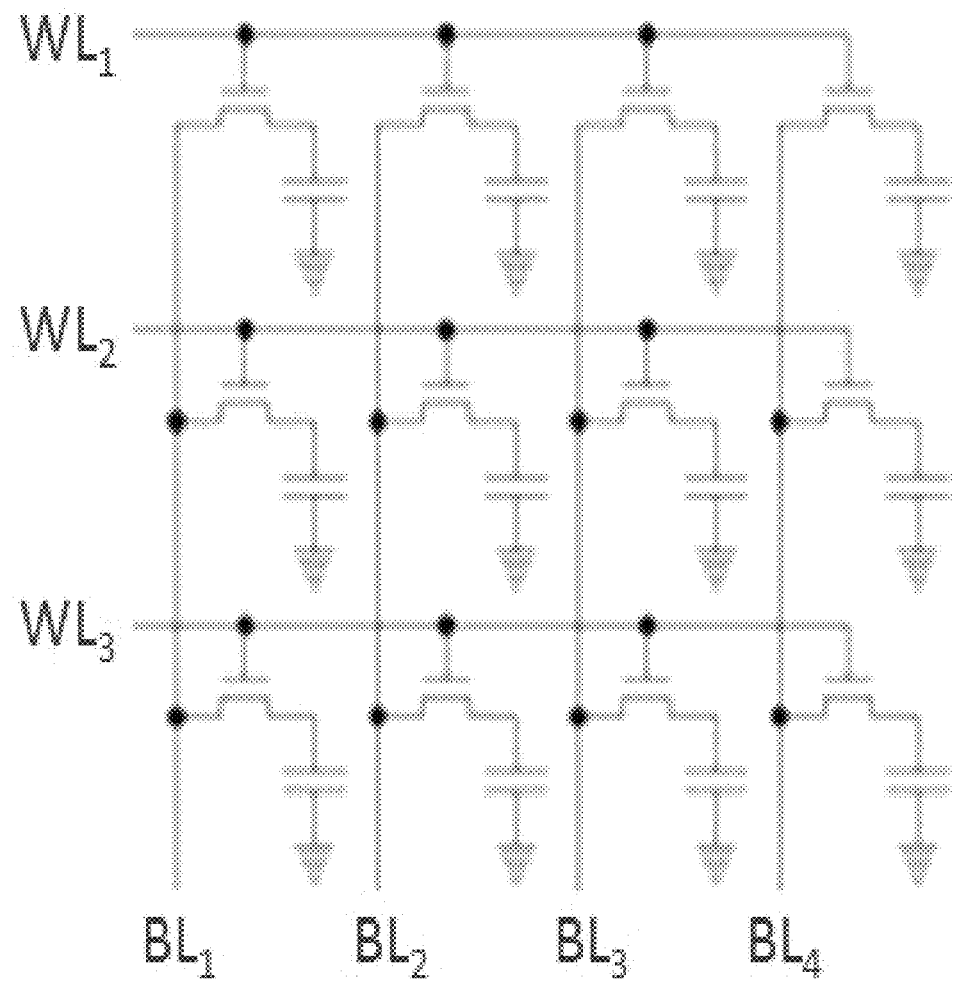

FIG. 11 illustrates method 1100 according to an embodiment of the invention.

Method 1100 differs from method 1000 by the following:
 a. Method 1100 starts by stage 1102 of retrieving metadata about a suggested duration of the shortened read attempt. The metadata was generated during one or more previous iteration of stage 290.
 b. Method 1100 includes stages 1110 and 1120 instead of stages 910 and 920. Stages 1110 and 1120 include performing shortened read attempt whereas the duration of the shortened read attempt is responsive to the suggested duration of metadata—as indicated in the metadata retrieved during stage 1102.

Stage 1110 includes performing a shortened read attempt of multiple Single Level Cell (SLC) data flash memory cells that store data to provide an estimate of the data. The duration of the shortened read attempt is responsive to the suggested duration.

Stage 1120 includes performing a shortened read attempt of SLC redundancy flash memory cells that store redundancy information to provide an estimate of the redundancy information. The estimate of the redundancy information is indicative of an expected number of data flash memory cells that store an erase logic value. The duration of the shortened read attempt is responsive to the suggested duration.

Stage 1102 may include retrieving the metadata from a buffer, from a cache or from any memory cells that differ from the memory cells that stores the information to be read. These memory cells can be faster than those that store the information itself. Alternatively, the retrieving of the information and the metadata can be done from the same block or page.

Any of the aforementioned methods can be executed by a computer that executes instructions stored in a non-transitory computer readable medium such as disk, diskette, tape, integrated circuit, storage device and the like.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A non-transitory computer readable medium that stores instructions for: performing a shortened read attempt of data and redundant information to provide an estimate of the data and an estimate of the redundant information; wherein the shortened read attempt has a duration that is shorter than a duration of a full read attempt; processing the estimation of the data to provide a first signature; processing the estimation of the redundant information to provide a second signature; comparing the first signature to the second signature; and providing the estimate of the data as a read result if the first and second signatures equal each other; wherein errors introduced by the shortened read attempt of the data only result in an over-estimation of an amount of charge stored in memory cells that store the data; whereon errors introduced by the shortened read attempt of the redundant information only result in an under-estimation of the amount of charge stored in the memory cells that store the data.

2. The non-transitory computer readable medium according to claim 1 wherein the redundant information is indicative of a number of zeros in the data.

3. The non-transitory computer readable medium according to claim 1 that stores instructions for repeating the stages of performing the shortened read attempt, processing the estimation of the data, processing the estimation of the redundant information and comparing the first signature to the second signature until the first signature equals the second signature.

4. The non-transitory computer readable medium according to claim 1 that stores instructions for attempting to correct at least one of the estimation of the data and the estimation of the redundant information.

5. The non-transitory computer readable medium according to claim 1 that stores instructions for tracking durations of multiple shortened read attempts and successes and failures of the multiple shortened read attempts to provide a tracking result; and determining a duration of at least one future shortened read attempt in response to the tracking result.

6. The non-transitory computer readable medium according to claim 1 that stores instructions for performing a shortened read attempt of multiple data memory cells that store data to provide an estimate of the data; performing a shortened read attempt of redundant memory cells that store redundant information to provide an estimate of the redundant information;
 wherein the second signature is indicative of an expected number of data memory cells that store a certain logic value; wherein the first signature is indicative of an estimated number of data memory cells that store the certain logic value;
 comparing the expected number of data memory cells that store the certain logic value to the estimated number of data memory cells that store the certain logic value; and
 providing the estimate of the data as a read result if the expected number of data memory cells that store the certain logic value and the estimated number of data memory cells that store the certain logic value equal each other; wherein errors induced by any shortened read attempt affect the expected number of data memory cells that store the certain logic value and the estimated number of data memory cells that store the certain logic value in different manners.

7. The non-transitory computer readable medium according to claim 6, wherein data memory cells differ from redundant memory cells.

8. A method for reading a memory cell array, the method comprises: performing a shortened read attempt of data and redundant information to provide an estimate of the data and an estimate the redundant information; wherein the shortened read attempt has a duration that is shorter than a duration of a full read attempt; processing the estimation of the data to provide a first signature; processing the estimation of the redundant information to provide a second signature; and comparing the first signature to the second signature; providing the estimate of the data as a read result if the first and second signatures equal each other; wherein errors introduced by the shortened read attempt of the data only result in an over-estimation of an amount of charge stored in memory cells that store the data; whereon errors introduced by the shortened read attempt of the redundant information only result in an under-estimation of the amount of charge stored in the memory cells that store the data.

9. The method according to claim 8, wherein the redundant information is indicative of a number of zeros in the data.

10. The method according to claim 8, comprising repeating the stages of performing the shortened read attempt, processing the estimation of the data, processing the estimation of the redundant information and comparing the first signature to the second signature until the first signature equals the second signature.

11. The method according to claim 8, comprising attempting to correct at least one of the estimation of the data and the estimation of the redundant information.

12. The method according to claim 8, comprising tracking durations of multiple shortened read attempts and successes and failures of the multiple shortened read attempts to provide a tracking result; and determining a duration of at least one future shortened read attempt in response to the tracking result.

13. The method according to claim 12, wherein the tracking result is further responsive to a state of the memory cell array.

14. The method according to claim 8, wherein data memory cells differ from redundant memory cells.

15. The method according to claim 8, wherein at least one data memory cell is also a redundant memory cell.

16. The method according to claim 8 whereon errors introduced by the shortened read attempt of the redundant information only result in an over-estimation of the amount of charge stored in the memory cells that store the redundant information.

17. The method according to claim 8, wherein the estimation of the data represents an estimated amount of charge being stored at the multiple data memory cells; wherein the data represents an actual amount of charge being stored at the multiple data memory cells; wherein the actual amount of charge does not exceed the estimated amount of charge.

18. The method according to claim 8, comprising declaring a shortened read attempt error.

19. The method according to claim 8, comprising performing a read attempt of a duration that exceeds the duration of the shortened read attempt.

20. The method according to claim 8, comprising correcting the estimation of the data, by applying an error correction decoding process, if the expected number differs from the estimated number.

21. The method according to claim 8, comprising correcting the estimation of the redundant information, by applying an error correction decoding process, if the expected number differs from the estimated number.

22. The method according to claim 8, comprising performing a full duration read attempt if the expected number differs from the estimated number.

23. The method according to claim 8, wherein the memory cells are single level cells (SLC) flash memory cells; wherein the certain logic value is an erase logic value.

24. The method according to claim 8, wherein the memory cells are single level cells (SLC) flash memory cells; wherein the estimate of the redundant information is indicative of an expected number of data memory cells that are programmed.

25. The method according to claim 8, wherein the memory cells are multiple level cells (MLC) to be read by a set of reference voltages, the set of reference voltages comprises multiple reference voltages that differ from one another; wherein the method comprises repeating, for at least one reference voltage of the multiple reference voltages, the stages of: performing, using the reference voltage, a shortened read attempt of multiple data memory cells that store data to provide an estimate of the data; performing, using the reference voltage, a shortened read attempt of redundant memory cells that store redundant information that is associated with the reference voltage to provide an estimate of the redundant information; wherein the redundant information is indicative of a reference-voltage-associated expected number of data memory cells that store a logic value that is determined by supplying the reference voltage to the data memory cells; determining, based on the estimate of the data, a reference-voltage-associated estimated number of data memory cells that store the logic value; wherein the method further comprises processing multiple reference-voltage-associated expected numbers and multiple reference-voltage-associated estimated numbers to determine whether at least one shortened read attempt introduced errors.

26. The method according to claim 25, comprising: comparing, for each reference voltage of that at least one reference voltages, a reference-voltage-associated expected number and a reference-voltage-associated estimated number that are associated with the reference voltage; and declaring a shortened read attempt error if at least one of the comparing is indicative of a mismatch between a reference-voltage-associated expected number and a reference-voltage-associated estimated number that are associated with a same reference voltage.

27. The method according to claim 25, comprising: adding all the reference-voltage-associated expected numbers to provide an aggregate expected number; adding all the reference-voltage-associated estimated numbers to provide an aggregate estimated number; comparing the aggregate expected number to the aggregate estimated number; and declaring a shortened read attempt error if the aggregate expected number to the aggregate estimated number.

28. The method according to claim 13, further comprising error correcting the estimate of the redundant information to provide the expected number.

29. The method according to claim 8, comprising calculating a suggested duration of a next shortened read attempt.

30. The method according to claim 29 comprising storing metadata reflecting the suggested duration of the next shortened read attempt.

31. The method according to claim 30, comprising retrieving the metadata and performing at least one shortened read attempt of a suggested duration.

32. The method according to claim 8, wherein the memory cells are dynamic random access memory (DRAM) cells.

33. A device, comprising: a shortened read circuit arranged to: perform a shortened read attempt of data and redundant information to provide an estimate of the data and an estimate the redundant information; wherein the shortened read attempt has a duration that is shorter than a duration of a full read attempt; and a controlling circuit arranged to: process the estimation of the data to provide a first signature; process the estimation of the redundant information to provide a second signature; compare the first signature to the second signature; and provide the estimate of the data as a read result if the first and second signatures equal each other; wherein errors introduced by the shortened read attempt of the data only result in an over-estimation of an amount of charge stored in memory cells that store the data; whereon errors introduced by the shortened read attempt of the redundant information only result in an under-estimation of the amount of charge stored in the memory cells that store the data.

34. The device according to claim 33 wherein the redundant information is indicative of a number of zeros in the data.

35. The device according to claim 33, wherein the controller circuit is further arranged to attempt to correct at least one of the estimation of the data and the estimation of the redundant information.

36. The device according to claim 33, wherein the second signature is indicative of an expected number of data memory cells that store a certain logic value; and wherein the first signature is indicative of an estimated number of data memory cells that store the certain logic value.

37. The device according to claim 33 wherein the device is further arranged to track durations of multiple shortened read attempts and successes and failures of the multiple shortened read attempts to provide a tracking result; and determine a duration of at least one future shortened read attempt in response to the tracking result.

38. The device according to claim 37 wherein the wherein the tracking result is further responsive to a state of the memory cell array.

39. The device according to claim 33 whereon errors introduced by the shortened read attempt of the redundant information only result in an over-estimation of the amount of charge stored in the memory cells that store the redundant information.

40. The non-transitory computer readable medium according to claim 1 that stores instructions for tracking durations of multiple shortened read attempts and successes and failures of the multiple shortened read attempts to provide a tracking result; and determining a duration of at least one future shortened read attempt in response to the tracking result.

41. The non-transitory computer readable medium according to claim 40 wherein the tracking result is further responsive to a state of the memory cell array.

42. The non-transitory computer readable medium according to claim 1 whereon errors introduced by the shortened read attempt of the redundant information only result in an over-estimation of the amount of charge stored in the memory cells that store the redundant information.

\* \* \* \* \*